(12) United States Patent
Dodoc et al.

(10) Patent No.: US 7,751,129 B2
(45) Date of Patent: Jul. 6, 2010

(54) REFRACTIVE PROJECTION OBJECTIVE FOR IMMERSION LITHOGRAPHY

(75) Inventors: Aurelian Dodoc, Oberkochen (DE);
Wilhelm Ulrich, Aalen (DE);
Hans-Juergen Rostalski, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 677 days.

(21) Appl. No.: 10/576,754

(22) PCT Filed: Oct. 22, 2003

(86) PCT No.: PCT/EP03/11677

§ 371 (c)(1),
(2), (4) Date: May 7, 2007

(87) PCT Pub. No.: WO2005/050321

PCT Pub. Date: Jun. 2, 2005

(65) Prior Publication Data

US 2008/0043345 A1 Feb. 21, 2008

(51) Int. Cl.
*G02B 9/60* (2006.01)

(52) U.S. Cl. .................. 359/770; 359/763; 359/714; 359/649

(58) Field of Classification Search .................. 359/649, 359/714, 713, 754–756, 761, 763, 770; 355/53, 355/67
See application file for complete search history.

(56) References Cited

U.S. PATENT DOCUMENTS 4,480,910 A 11/1984 Takanashi et al.
(Continued)

FOREIGN PATENT DOCUMENTS

DE 101 11 299 A 9/2002
(Continued)

OTHER PUBLICATIONS

W. J. Smith, "Stops and Apertures", Modern Optical Engineering, McGraw -Hill Book Company 2000, New York NY, pp. 141-143.
(Continued)

*Primary Examiner*—Darryl J Collins
(74) *Attorney, Agent, or Firm*—Sughrue Mion, PLLC

(57) ABSTRACT

A purely refractive projection objective suitable for immersion microlithography is designed as a single-waist system with five lens groups in the case of which a first lens group of negative refractive power, a second lens group of positive refractive power, a third lens group of negative refractive power, a fourth lens group of positive refractive power and a fifth lens group of positive refractive power are provided. The fourth lens group has an entrance surface (E) that lies in the vicinity of a point of inflection of a marginal ray height between the third lens group (LG3) and the fourth lens group (LG4). No negative lens of substantial refractive power is arranged between the entrance surface and the system diaphragm (5). Embodiments of inventive projection objectives achieve a very high numerical aperture NA>1 in conjunction with a large image field and are distinguished by a compact design size. For working wavelengths below 200 nm, structural widths of substantially under 100 nm can be resolved when use is made of immersion fluids between the projection objective and substrate.

53 Claims, 6 Drawing Sheets

U.S. PATENT DOCUMENTS

| | | | |
|---|---|---|---|
| 5,610,683 | A | 3/1997 | Takahashi |
| 6,008,884 | A | 12/1999 | Yamaguchi et al. |
| 6,714,280 | B2 | 3/2004 | Omura |
| 6,788,387 | B2 | 9/2004 | Schuster et al. |
| 6,912,094 | B2 | 6/2005 | Shigematsu et al. |
| 2003/0030916 | A1 | 2/2003 | Suenaga |
| 2003/0206282 | A1* | 11/2003 | Omura ........................ 355/67 |

FOREIGN PATENT DOCUMENTS

| | | |
|---|---|---|
| DE | 102 10 899 A | 9/2003 |
| JP | 10-303114 A | 11/1998 |
| JP | 11-6957 A | 1/1999 |
| JP | 2000-231058 A | 8/2000 |
| JP | 2002-244036 A | 8/2002 |
| JP | 2002-287023 A | 10/2002 |
| JP | 2002-323653 A | 11/2002 |
| JP | 2004-335746 A | 11/2004 |

OTHER PUBLICATIONS

M. Switkes and M. Rothchild, "Immersion Lithography At 157 NM", American Vacuum Society, J. Vac. Sci. Technologies B 19(6), Nov./Dec. 2001, pp. 2353-2356, Lexington, Massachusetts.

* cited by examiner

REFRACTIVE PROJECTION OBJECTIVE FOR IMMERSION LITHOGRAPHY

This application is the National Stage of International Application No. PCT/EP2003/011677, filed Oct. 22, 2003.

The invention relates to a refractive projection objective for imaging a pattern, arranged in an object plane of the projection objective, into an image plane of the projection objective, with the aid of an immersion medium that is arranged between a last optical element of the projection objective and the image plane.

Photolithographic projection objectives have been in use for several decades for producing semiconductor components and other finely structured structural elements. They serve the purpose of projecting patterns of photomasks or reticles, which are also denoted below as masks or reticles, onto an object coated with a photosensitive layer with very high resolution on a reducing scale.

Three developments running in parallel chiefly contribute to the production of ever finer structures of the order of magnitude of 100 nm or below. Firstly, an attempt is being made to increase the image-side numerical aperture (NA) of the projection objectives beyond the currently customary values into the region of NA=0.8 or above. Secondly, ever shorter wavelengths of ultraviolet light are being used, preferably wavelengths of less than 260 nm, for example 248 nm, 193 nm, 157 nm or below. Finally, still other measures are being used to increase resolution, for example phase-shifting masks and/or oblique illumination.

In addition, there are already approaches to improving the achievable resolution by introducing an immersion medium of high refractive index into the space between the last optical element of the projection objective and the substrate. This technique is denoted here as immersion lithography. The projection objectives suitable for this purpose are denoted as immersion objectives or immersion systems. Introducing the immersion medium yields an effective wavelength of $\lambda_{eff}=\lambda_0/n$, $\lambda_0$ being the vacuum operating wavelength and n the refractive index of the immersion medium. This yields a resolution of $R=k_1 (\lambda_{eff}/NA_0)$ and a depth of focus (DOF) of $DOF=\pm k_2 (\lambda_{eff}/NA_0^2)$, $NA_0=\sin \Theta_0$ being the "dry" numerical aperture, and $\Theta_0$ being half the aperture angle of the objective. The empirical constants $k_1$ and $k_2$ depend on the process.

The theoretical advantages of immersion lithography reside in the reduction of the effective operating wavelength and the resolution improved thereby. This can be achieved in conjunction with an unchanged vacuum wavelength, and so established techniques for producing light, for selecting optical materials, for coating technology etc. can be adopted largely without change for the appropriate wavelength. However, measures are required for providing projection objectives with very high numerical apertures in the region of NA=1 or above. Furthermore, suitable immersion media must be available.

Ultrapure water with $n_1 \approx 1.43$ emerges as a suitable immersion medium for 193 nm.

The article entitled "Immersion Lithography at 157 nm" by M. Switkes and M. Rothschild, J. Vac. Sci. Technol. Vol. 19 (6), Nov./Dec. 2001, pages 1 ff. presents immersion fluids based on perfluoropolyethers (PFPE) which are sufficiently transparent for a working wavelength of 157 nm and are compatible with some photoresist materials currently being used in microlithography. One tested immersion fluid has a refractive index of $n_1=1.37$ at 157 nm. The publication also describes a lens-free optical system, operating with calcium fluoride elements and silicon mirrors, for immersion interference lithography, which is intended to permit the imaging of 60 nm structures and below in conjunction with a numerical aperture of NA=0.86. The optical system may not be suitable for use in the series production of semiconductors or the like.

Patent specifications U.S. Pat. No. 4,480,910 and U.S. Pat. No. 5,610,683 (corresponding to EP 0 605 103) describe projection exposure machines, provided for immersion lithography, having devices for introducing immersion fluid between the projection objective and the substrate. No design is specified for the optical projection system.

It is the object of the invention to provide a refractive projection objective that is suitable for immersion lithography has a compact overall size and can be produced with acceptable use of materials.

This object is achieved by means of a projection objective having the features of claim 1. Advantageous developments are specified in the dependent claims. The wording of all the claims is incorporated in the description by reference.

In accordance with one aspect of the invention, a refractive projection objective for imaging a pattern, arranged in an object plane of the projection objective, into the image plane of the projection objective, with the aid of an immersion medium that is arranged between a last optical element of the projection objective and the image plane has a first lens group following the object plane of negative refractive power;

a second lens group following thereupon and of positive refractive power;

a third lens group following thereupon and of negative refractive power;

a fourth lens group following thereupon and of positive refractive power;

a fifth lens group following thereupon and of positive refractive power; and a system diaphragm that is arranged in a transition region from the fourth lens group to the fifth lens group, wherein the fourth lens group has an entrance surface that lies in the vicinity of a point of inflection of a marginal ray height between the third lens group and the fourth lens group, and no negative lens of substantial refractive power is arranged between the entrance surface and the system diaphragm.

A "negative lens of substantial refractive power" in the meaning of the invention is a lens with a substantially diverging effect for the optical design. This includes, in particular, negative lenses of a refractive power $\phi$ for which it holds that: $|\phi|>0.12$ m$^{-1}$ (dpt, diopters).

A marginal ray height is the perpendicular distance of a marginal ray from the optical axis, a marginal ray leading from the middle of the object field to the diaphragm edge of the system diaphragm determining the numerical aperture used.

It is preferred to provide no negative lens at all between the entrance surface of the fourth lens group and the system diaphragm such that seated in this region are only positive lenses that counteract an excessively strong enlargement of the beam diameter in the divergent beam path downstream of the entrance surface.

If, in accordance with this aspect of the invention, negative lenses of appreciable refractive power are dispensed with in the region of relatively large beam diameters, it is possible thereby to restrict the maximum diameter of the lenses in this region to a feasible extent. "Relatively high beam diameters" within the meaning of this application are present, in particular, whenever the marginal ray height at a lens is at least as large as half the marginal ray height at the system diaphragm. The invention takes account of the fact that although the divergent effect of a negative lens can be desirable on the grounds of correction, any divergent effect downstream of the negative lens leads to potentially larger lens diameters than would be necessary in the absence of an active lens. In addition, the rays of the beam must be recombined in the direction of the downstream image plane, something which requires positive refractive power. The positive lenses required therefor can be of more moderate design overall when there is not also a need to compensate the divergent effect of negative lenses when bringing the rays together. In addition, the number of lenses can be restricted. The invention thus enables compact projection objectives with a minimal lens mass.

In some embodiments, no negative lens is arranged between the system diaphragm and the image plane. Consequently, this region can be constructed exclusively with positive lenses that can, if appropriate, be supplemented by an approximately or completely plane-parallel plate.

The inventive refractive power distribution over the individual lens groups produces a projection objective having two bellies and a waist therebetween, the result being a good correction of the field curvature. It is provided here in the case of preferred embodiments to minimize the number of the changes required for optical correction between lenses of negative and positive refractive power. In one embodiment, a waist of minimal beam diameter exists in the region of the third lens group. There is a lens pair having lenses immediately following one another and for which $\phi_i*\phi_{i+1}<0$ between this waist and the image plane at only one location, $\phi_i$ and $\phi_{i+1}$ being the refractive powers of the lenses of the lens pair, and, $|\phi|>0.12$ m$^{-1}$. It is advantageous when lens pairs having such a change between positive and substantially negative refractive power (or vice versa) occur between the object plane and the image plane at only three locations. It is possible thereby to promote the low mass design of such projection objectives.

It is known that the correction of chromatic aberrations without the use of a second material stimulates additional geometric conditions that must be fulfilled by the beams in the various objective parts. A second optical material can be used in order to circumvent these additional conditions. However, in the wavelength region of deep ultraviolet (DUV) which are provided to the preferred embodiments of the invention, only a few transparent optical materials with sufficiently low absorption are available. For applications at 193 nm, use is made chiefly of synthetic silica glass (SiO$_2$) as principal material and, as second type of material, fluoride crystal materials such as calcium fluoride (CaF$_2$) or barium fluoride (BaF$_2$). As a rule, at 157 nm calcium fluoride is used as principal material and barium fluoride as second material. The targeted use of calcium fluoride at 193 nm can also contribute to securing a longer service life of the objective, since the changes in density observed in synthetic quartz glass do not occur in calcium fluoride given high radiation densities. The fluoride crystal materials that can be used in addition to synthetic quartz glass have substantial disadvantages, however. On the one hand, they are available only to a restricted extent and so the procurement costs are high. In addition, some physical and chemical properties render it difficult to fabricate the optics. Consequently, aspheric surfaces are used to support the image correction in some embodiments.

In one embodiment, the first lens group includes at least one aspheric surface, at least two aspheric surfaces preferably being provided in the first lens group. An arrangement of aspheres in a region that is near the field and in which the principal ray height is substantially greater than the marginal ray height can be used for an effective distortion correction. The first lens group preferably includes two lenses with in each case one aspheric surface. The distribution of aspheres over a number of lenses simplifies the production, since it is possible to avoid large surface deformations.

It has proved to be advantageous when there is arranged in a first lens region, which is near the field, in which the principal ray height is large as against the marginal ray height, at least one aspheric surface that has a curvature which has at most one point of inflection in an optically useful range. Two such surfaces can be provided, for example. More than three surfaces with one or more points of inflection should be avoided. Aspheric surfaces that have no, or at most one, point of inflection of the curvature in the optically useful range can be effectively mastered in terms of production engineering and can be produced with slight surface roughnesses.

At least one aspheric surface should preferably occur in the first lens region. It is advantageous, furthermore, when all the aspheres of the first lens region fulfill the condition $|\Sigma C1_i|*10^6>0.22$, $C1_i$ being the coefficient of the term $h^4$ of the aspheric surface representation of the ith surface. The parameter $C1_i$ thereby represents the principal components for deformations of aspheres.

It is provided in some embodiments that aspheric surfaces with an optically useful diameter of more than 20% of the overall length (object plane/image plane distance) of the projection objective are concave. In the case of some embodiments, this holds for all of the aspheric surfaces. If this condition is observed, the asphere can be tested with sufficient accuracy at an acceptable outlay.

It has proved to be advantageous with regard to distortion correction when there are arranged in a second lens region, which extends between the object plane and a region in which the principal ray height corresponds substantially to the marginal ray height, at least two aspheric surfaces whose aspheric contributions to distortion are of opposite sides. This contribution can be determined in accordance with $(8*C1+k*c^3)(n-n')yy_p^3$, $C1$ being the asphere coefficient, k the conic constant of the asphere, c the curvature, n and n' the indices of refraction upstream and downstream of the surface, y the paraxial marginal ray height at the surface and $y_p$ the paraxial principal ray height at the surface.

In some embodiments, an advantageous decoupling of optical means for the purpose of providing object-side telecentrism, and of correcting distortions can be achieved by virtue of the fact that the condition $0.9*PSA31<PSA3<1.1*PSA31$ is fulfilled for the spherical-pupil aberration PSA. Here, PSA31 is the sum of the aberration coefficients of the spherical pupil aberration of all the surfaces inside the first lens region, while PSA3 is the sum of the aberration coefficients are the spherical pupil aberration of all the surfaces of the system. By observing this condition, it is possible to concentrate the pupil aberrations chiefly in the first lens region near the object plane. This is advantageous for decoupling between influencing telecentrism and influencing distortion.

Advantageous embodiments of inventive projection objectives have an object/image spacing L, and a focal length f' and use an immersion medium with a refractive index $n_I$, the following condition being fulfilled: $L/f'*n_I>2.5$. Compact systems with short focal lengths are possible when this condition is observed.

The system diaphragm can be a planar system diaphragm in the case of which the diaphragm edge remains independent of the diaphragm diameter set in a plane perpendicular to the optical axis. In systems having diaphragm errors, it can be advantageous when the system diaphragm has a diaphragm edge that determines the diaphragm diameter and whose axial position with reference to the optical axis of the projection objective can be varied as a function of the diaphragm diameter. This permits optimum adaptation of the effective diaphragm position to the beam path as a function of the diaphragm diameter. The system diaphragm can be designed, for example, as a spherical diaphragm in which the diaphragm edge can be moved along a spherical surface during adjustment of the diaphragm diameter. It is also possible to design the system diaphragm as a conical diaphragm in which the diaphragm edge can be moved on a lateral surface of the cone during adjustment of the diaphragm diameter. This can be achieved, for example, by means of an axially displaceable planar diaphragm.

The invention enables the design of projection objectives whose image-side numerical aperture is NA≧0.9, NA>0.98, in particular NA=1.0, NA=1.1 or above, also being possible for some embodiments. The projection objectives can be adapted to an immersion fluid that has a refractive index of $n_1$>1.3 at the operating wavelength. As a result, the effective operating wavelength can be reduced by approximately 30% or more by comparison with systems without immersion.

Projection systems according to the invention can be provided for a wide range of suitable working distances. In this case, the object-side working distance or the working distance in the object space is the (smallest) axial distance between the object plane and the entrance surface of the objective, while the image-side working distance or the working distance in the image space is the (smallest) axial distance between the exit surface of the objective and the image plane. The working distance in the image space, which is filled with gas in the event of use as a dry system, is filled with an immersion medium during operation in the case of immersion systems.

In the case of immersion systems, special criteria are to be considered when fixing the working distance in the image space. A large working distance on the one hand effects both heavier radiation losses because of the usually lower transmission of immersion liquids (by comparison with gases), and a higher contribution to aberration from the surfaces bearing against the image plane, specifically for spherical aberration. On the other hand, the image-side working distance should be large enough to permit a laminar flow of an immersion fluid. If appropriate, there should also be room for measuring instruments and sensors. In embodiments most preferred, the image-side working distance is between approximately 1 mm and approximately 15 mm, in particular between approximately 1.5 mm and approximately 10 mm. Values lying between approximately 5 mm, on the one hand, and approximately 25% to 50% of the object field diameter, on the other hand, have proved to be advantageous for the object-side working distance. Although it is true that values below 5 mm are likewise possible, the requirements placed on surface quality and material quality of the first lens elements, in particular with regard to striations, become more demanding.

Preferred embodiments are designed as reduction objectives. The magnitude |β| of the magnification ratio is preferably in the range from 1/5 to 1/3, in particular between 1/4.5 and 1/3.5, such that, in particular, reductions of 5:1 and 4:1 are possible.

In a particular embodiment, there is provided in a transition region from the third lens group to the fourth lens group, that is to say in a region of substantially rising beam diameter and divergent radiation, at least one lens doublet that comprises a negative lens and a positive lens following directly in the transmission direction, the negative lens having an image-side concave surface, and the subsequent positive lens having an object-side concave surface. A biconvex air lens is thereby produced between the lenses of the doublet. In particular, the positive lens is a positive meniscus lens concave relative to the object plane and has an entrance-end lens radius R1 and an exit-end lens radius R2, the following condition holding: (R1+R2)/(R1−R2)<−1.5. Occurring in the region of the lens doublet, in particular at the concave exit end, curved against the beam path, of the negative lens are high incidence angles of the penetrating radiation that can make a very effective contribution to the correction of the overall system. At least one of the lens surfaces bordering the inner air lens can be aspheric. It is preferred for both boundary surfaces to be aspheric.

In one development, at least one meniscus lens of positive or weakly negative refractive power that is concave relative to the object plane and fulfills the condition $D_L/D_{min}$>1.3 is arranged in the fourth lens group, $D_{min}$ being the smallest light pencil diameter in the fourth lens group and $D_L$ being the maximum light pencil diameter in the meniscus lens. A combination of a weakly negative meniscus lens with a positive lens in the diaphragm region can make an effective contribution to the correction of aperture-dependent aberrations, in particular the spherical aberration.

In some embodiments, all the lenses of the projection objective consist of the same material. The material used can be, for example, synthetic silica glass for operating wavelengths of 193 nm, and calcium fluoride for operating wavelengths of 157 nm. The use of only one type of material makes the production easier and permits simple adaptation of the objective design to other wavelengths. It is also possible to combine a number of types of material in order, for example, to assist correction of chromatic aberrations. Also possible is the use of other UV-transparent materials such as $BaF_2$, NaF, LiF, SrF, $MgF_2$ or the like.

In some embodiments that are designed predominately from quartz glass lenses, at least two of the lens elements arranged in the immediate vicinity of the image plane consist of a fluoride crystal material of identical crystal orientation. The service life of the projection objectives can be improved thereby. It has proved to be advantageous for correcting the transverse chromatic aberration when at least one positive lens made from a fluoride crystal material is present in the second lens group. The use of a fluoride crystal material as lens material of a positive lens in the fourth lens group can also make an effective contribution to correcting the transverse chromatic aberration. The correction of the transverse chromatic aberration can be improved when a fluoride crystal material is used as lens material in the case of at least one negative lens of the third lens group.

In addition to emerging from the claims, the foregoing and further features also emerge from the description and the drawings, it being possible for the individual features to be implemented alone or multiply in the form of subcombinations for embodiments of the invention and in other fields, and to constitute advantageous designs which are patentable on their own merit.

In the following description of the preferred embodiments, the term "optical axis" denotes a straight line through the centers of curvature of the optical components. Directions and distances are described as on the image side or towards the image, when they are directed in the direction of the image plane or the substrate which is located there and is to be exposed, and as on the object side or towards the object when they are directed towards the object with reference to the optical axis. In the examples, the object is a mask (reticle) with the pattern of an integrated circuit, but another pattern, for example a grating, can also be involved. In the examples, the image is formed on a wafer serving as substrate and coated with a photoresist layer, but other substrates are also possible, for example elements for liquid crystal displays or substrates for optical gratings. The specified focal lengths are focal lengths with reference to air.

Figure 1:
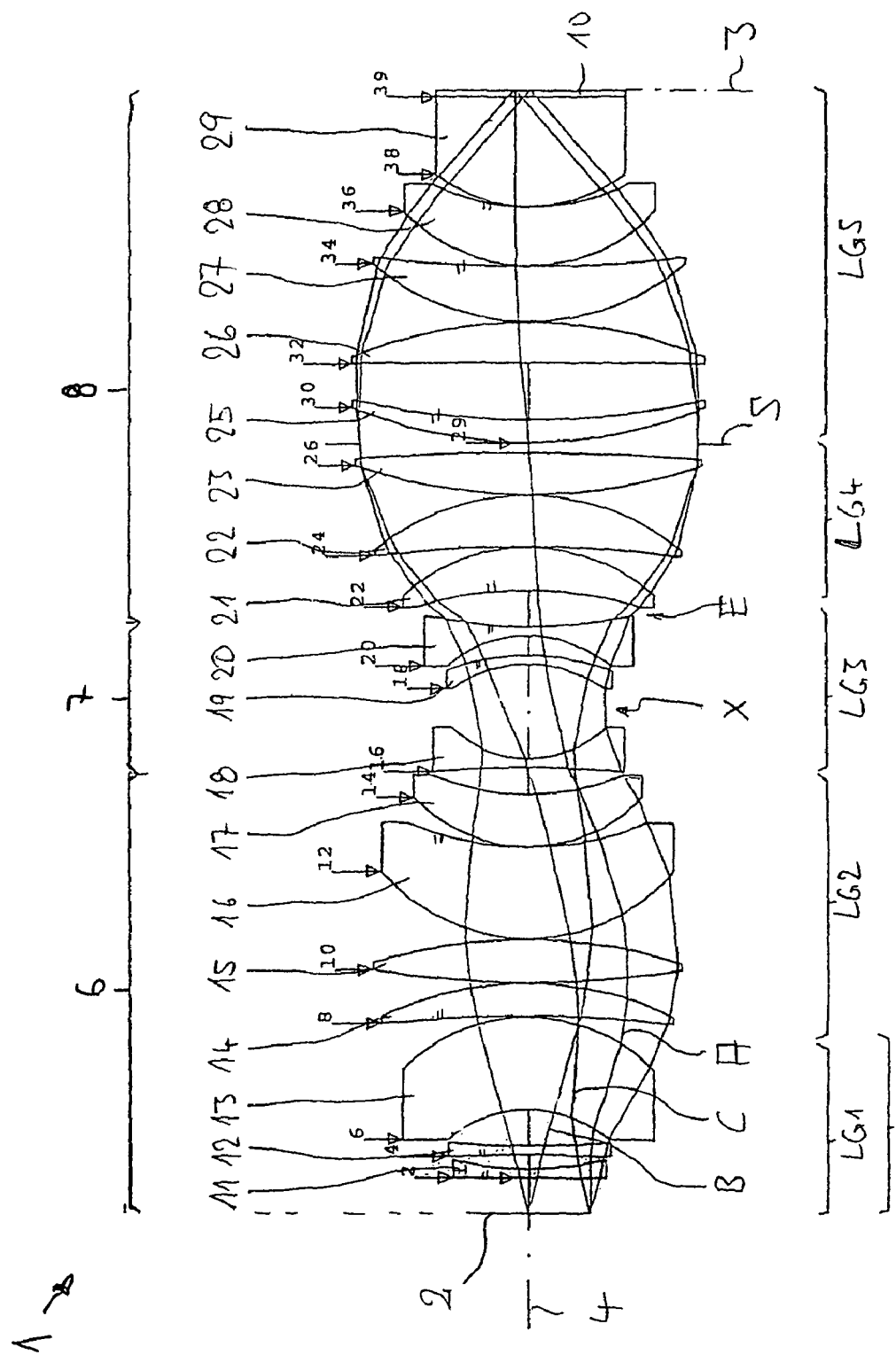
FIG. 1 is a lens section through a first embodiment of a refractive projection objective which is designed for an operating wavelength of 193 nm.

A typical design of an embodiment of an inventive, purely refractive reduction objective 1 is shown with the aid of FIG. 1. Given virtually homogenous immersion, it serves the purpose of imaging a pattern, arranged in an object plane 2, of a reticle or the like into an image plane 3 to a reduced scale, for example to the scale of 5:1 (magnification ratio β=0.2). This is a rotationally symmetrical single-waist system or two-belly system with five consecutive lens groups that are arranged along the optical axis 4, which is perpendicular to the object plane and image plane. The first lens group LG1 directly following the object plane 2 has a negative refractive power. A second lens group LG2 following directly thereupon has a positive refractive power. A third lens group LG3 following directly thereupon has a negative refractive power. A fourth lens group following directly thereupon has a positive refractive power. A fifth lens group LG5 following directly thereupon has a positive refractive power. The image plane directly follows the fifth lens group such that the projection objective has no further lens or lens group apart from the first to fifth lens group. This distribution of refractive power provides a two-belly system that has an object-side first belly 6, an image-side belly 8 and a waist 7 lying therebetween in which lies a waist X with a minimum beam diameter. In a transition region from the fourth lens group to the fifth lens group the system diaphragm 5 lies in the region of a relatively large beam diameter.

The projection possible with the aid of the projection objective can be characterized by the course of its principal rays and marginal rays. Denoted as principal ray A is a ray that runs from an outer marginal point of the object field parallel or at an acute angle to the optical axis and cuts the optical axis 4 in the region of the system diaphragm 5. A marginal ray B leads from the middle of the object field, that is to say from an axial field point, to the diaphragm edge of an aperture stop that is normally seated at the location of the system diaphragm 5 or in its immediate vicinity. A ray C that leads from an outer field point to the opposite edge of the aperture stop is denoted here as coma ray. The perpendicular distance of these rays from the optical axis yields the corresponding ray heights $h_A$, $h_B$ and $h_C$.

With reference to these beam paths, the fourth lens group LG4 has an entrance surface E that lies in the vicinity of a point of inflection of a marginal ray height in the third lens group LG3 and the fourth lens group LG4.

A first lens region LB1 begins at the object plane 2 and ends in the plane in which the marginal ray B and the coma ray C intersect such that the condition $|h_B/h_C|1$ is fulfilled in the first lens region LB1. The principal ray height is large in this lens region LB1 by comparison with the marginal ray height. Lens surfaces arranged here are denoted as near field. A second lens region LB2 extends from the object plane 2 as far as into the region in which the principal ray height and the marginal ray height are approximately equal in order of magnitude, in which case $|h_B/h_A<1.2$ holds, in particular. For typical variants of inventive projection systems, the length of the second lens region LB2 is greater than a quarter and smaller than half the distance L between the object plane 2 and image plane 3. This object-image distance is also denoted as the overall length of the projection objective.

For typical embodiments of inventive projection objectives, the first lens group LG1 has at least two negative lenses, the second lens group LG2 at least three positive lenses, the third lens group LG3 at least two negative lenses, the fourth lens group LG4 at least two positive lenses and the fifth lens group LG5 at least three positive lenses.

The first lens group LG1, which follows the object plane 2, is substantially responsible for widening the light bundle into the first belly 6. It has a thin negative lens 11 with an aspheric entrance surface, a further thin negative lens 12, following thereupon, with an aspheric entrance surface and a thick double spherical meniscus lens 13, following thereupon, with an object-side concave surface and of weak refractive power. The aspheres, arranged near the field, on the entrance surfaces of the lenses 11, 12 nearest the object contribute effectively to the good correction of the distortion and the astigmatism, above all the correction of telecentrism. The distribution of the asphericity over two lens surfaces of different lenses can simplify the production of the lenses.

The second lens group LG2 comprises four positive lenses 14, 15, 16, 17, specifically an entrance-end meniscus lens 14 with an aspheric entrance surface and an object-end concave surface, made by a biconvex lens 15, a thick positive meniscus lens 16 with an aspheric, concave exit surface and a further positive meniscus with the same sense of curvature of its spherical lens surfaces. This design, in the case of which the curvatures of the meniscus surfaces on the object side and image side of the biconvex lens 15 run in opposite senses and with mutually averted concave surfaces, ensures low superficial loadings for the meniscuses and the positive lens, and thus slight aberrations. A biconcave air lens between the biconvex positive lens 14 and the downstream meniscus 16 provides a strong astigmatic undercorrection, and therefore exerts an advantageous influence on the compensation of the contributions of astigmatism in the front part of the system upstream of the waist 7.

The third lens group 3 comprises three negative lenses 18, 19, 20. A biconcave lens 18 with spherical lens surfaces is arranged in this case at a distance upstream of the waist X of least beam diameter. Following at a distance downstream of the waist is a negative meniscus lens 19 with an object-side concave spherical entrance surface and an aspheric exit surface. Following this is a biconcave negative lens 20 with a spherical entrance surface and aspheric exit surface. The aspheric surfaces on the exit sides of the lenses 19, 20 make an extensive contribution to correcting the coma and the astigmatism.

The beam has maximum divergence downstream of the exit-end negative lens 20 of the third lens group LG3, very large incidence angles of the penetrating radiation that produce a strong corrective effect occurring on the aspheric exit side of the lens 20.

The fourth lens group LG4 comprises at its entrance end two positive meniscus lenses 21, 22 that are concave in relation to the object plane and which are followed by a biconvex positive lens 23 immediately upstream of the system diaphragm 5. Here, only the entrance surface of the front lens 21 is aspheric, all the other surfaces of the fourth lens group being spherical. Whereas the third lens group LG3 comprises only negative lenses and introduces a strong beam divergence, the subsequent fourth lens group LG4 comprises only positive lenses and exerts a strongly converging influence such that the divergent angle increases rapidly toward the system diaphragm 5. The transmission between negative and downstream positive refractive power produces between the third and fourth lens groups a point of inflection of the marginal ray height in the vicinity of which the entrance surface E of the fourth lens group lies. It is a particular feature of this design that there is no lens of negative refractive power arranged between this entrance surface E and the system diaphragm.

The fifth lens group LG5 lying downstream of the system diaphragm 5, is substantially responsible for the production of the high numerical aperture. Exclusively collective lenses are provided for this purpose, specifically a positive meniscus lens, seated immediately downstream of the system diaphragm, with a spherical entrance surface and an aspheric exit surface concave on the image side, a virtually planoconvex positive lens 26 with a virtually planar entrance surface and a convex exit surface, a positive meniscus lens 27, following thereupon, with a spherical entrance surface and an image-side concave, aspheric exit surface, a further positive meniscus lens 28 with a spherical entrance surface and an image-side concave, aspheric exit surface, and a terminating planoconvex lens 29 with a spherical entrance surface and a planar exit surface. The positive lenses exert a spherically strongly undercorrecting effect and, with respect to the coma, an overcorrecting effect. With this design, the correction of the spherical aberration and of the coma is largely borne by the weakly negative/positive doublet in the transition between the third and fourth lens groups, and by the aspheric surfaces, near the diaphragm, of the fourth and fifth lens groups. As a result, the fourth lens group LG4 and the fifth lens group LG5 are responsible in combination for achieving a good correction state of the spherical aberration and of coma.

The system has an object-side working distance (object back focal distance) of 32 mm and an image-side working distance of 6 mm that can be filled up by an immersion liquid 10. This system is designed such that deionized water (refractive index n≈1.47) or another suitable transparent liquid with a comparable refractive index can be used as immersion liquid at 193 nm.

The specification of the design is summarized in a known way in tabular form in table 1. Here, column 1 specifies the number of a refracting surface, or one distinguished in another way, column 2 specifies the radius r of the surface (in mm), column 4 specifies the distance d, denoted as thickness, of the surface from the following surface (in mm) and column 5 specifies the material of the optical components. Column 6 shows the refractive index of the material and the useful, free radii or half the free diameter of the lenses (in mm) are specified in column 7. The aspheric surfaces are denoted by "AS" in column 3.

In the case of the embodiment, ten of the surfaces, specifically the surfaces 2, 4, 8, 13, 19, 21, 22, 31, 35 and 37 are aspheric. Table 2 specifies the corresponding aspheric data, the aspheric surfaces being calculated using the following rule:

$$p(h)=[((1/r)h^2)/(1+SQRT(1-(1+K)(1/r)^2h^2))]+C1*h^4+C2*h^6+$$

Here, the reciprocal (1/r) of the radius specifies the surface curvature, and h the distance of a surface point from the optical axis (that is to say the ray height). Consequently, p(h) gives the so-called sagitta, that is to say the distance of the surface point from the surface apex in the z direction, that is to say in the direction of the optical axis. The constants K, C1, C2, . . . are reproduced in Table 2.

The optical system 1, which can be reproduced with the aid of these data, is designed for an operating wavelength of approximately 193 nm, for which the synthetic quartz glass used for all the lenses has a refractive index n=1.5608. The image-side numerical aperture is 1.0. The object-side and image-side telecentric system is adapted to a refractive index of the immersion medium 10 of $n_f$=1.47. The objective has an overall length L (distance between image plane and object plane) of approximately 1037 mm. A photoconductance (product of numerical aperture and image size) of approximately 22 mm is achieved for an image size of approximately 22 mm.

A few particular features of the projection objective are explained below. The projection object has only five negative lenses, which are concentrated on the one hand near the object at the input (lenses 11, 12) and on the other hand in the region of the waist 7 (lenses 18, 19 and 20). Consequently, it is only at three sites in the system that there is a transition between lenses of different sign of refractive power, specifically a negative/positive transition within the first lens group LG1 between the lenses 12 and 13, a positive/negative transition between the lens groups LG2 and LG3 or the lenses 17 and 18, and a negative/positive transition between the lens groups LG3 and LG4. Only positive lenses are located up to the object plane downstream of the last transition, which takes place in the region of the entrance surface E of the fourth lens group and defines a point of inflection in the profile of the marginal ray height downstream of the location X of narrowest constriction. By dispensing with negative lenses in this region, and owing to the possibility thereby of avoiding diverging refractive powers, it is possible for the lens diameters in the second belly 8 to be kept relatively slight, as a result of which the design can be of low mass overall. At the same time, the number of lenses can be kept low; only ten lenses occur between the location X of narrowest constriction and the image plane, and there are only 18 lenses in the entire system. This likewise promotes a compact design of low mass.

With one exception (convex exit side of the smallest lens 19 in the waist 7), all the aspheres are located on concave lens surfaces. This facilitates the testing of the aspheres when producing the lenses because, by contrast with the testing of convex surfaces, it is possible to use relatively compact test optics for testing concave surfaces. It may be seen from the asphere data in table 2 that no strong deformations occur with the aspheres and that the aspheric surfaces have either no, or at most one, point of inflection in their curvature. This facilitates the fabrication of the aspheres, thus enabling, in particular, aspheric surfaces with low surface roughnesses.

The biconcave negative lens 20 at the exit of the third lens group LG3, and the positive meniscus lens 21 concave on the image side, at the input of the fourth lens group LG4, form a negative/positive lens doublet that makes a substantial contribution to the total correction of the system. This can be influenced by the design of the mutually facing aspheric surfaces of this lens doublet, which delimit a biconvex air lens at which high incidence angles of the radiation occur. It is chiefly the spherical aberration of all orders that are corrected thereby. At the same time, other aberrations of higher order such as coma and astigmatism are also strongly influenced. Because of the high incidence angles, the image-side surface of the lens 20 acts in a strongly overcorrecting fashion on the spherical aberration. By contrast therewith, the shape of the object-side surface of the next lens has an effect such that the rays with small incidence angles impinge thereon, and so only small contributions to the spherical aberration are produced. The soft deflection of the rays in the lens groups LG4 and LG5 does undercorrect the spherical aberration, but not strongly enough to exceed the overcorrection. A virtually complete correction is achieved in this way.

Figure 2:
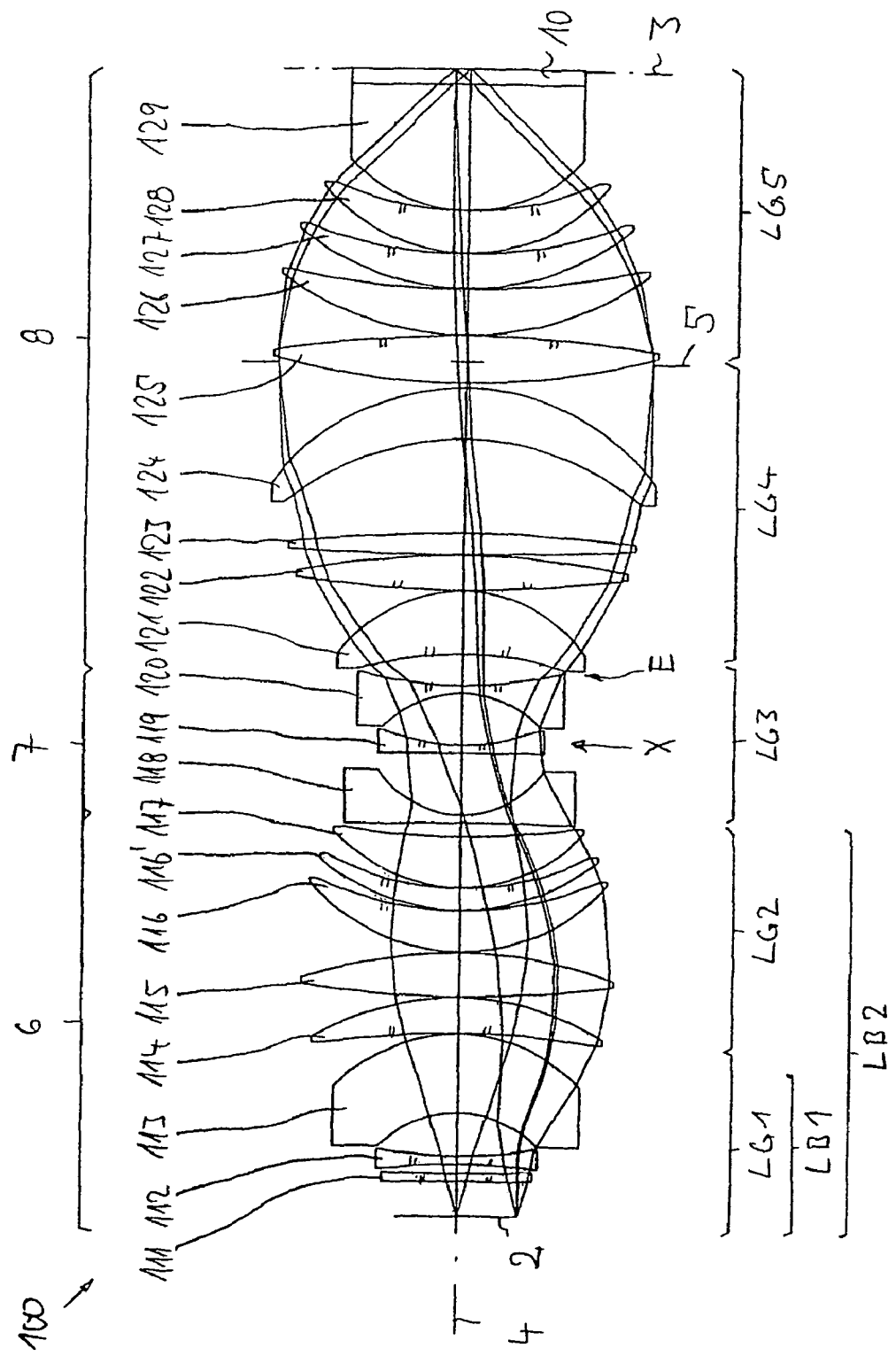
FIG. 2 is a lens section through a second embodiment of a projection objective which is designed for an operating wavelength of 193 nm.

A variant of the embodiment shown in FIG. 1 is explained with the aid of FIG. 2. Here, the features of the basic design are denoted by the same reference symbols as in FIG. 1. The system has an image-side numerical aperture NA=1.1. The specification of this design is to be found in tables 3 and 4.

The design of the first lens group LG1 and of the second lens group LG2 corresponds substantially to the first embodiment in FIG. 1. By contrast therewith, the thick positive meniscus lens 16 there is split into two thinner positive meniscus lenses 116, 116', as a result of which it is possible to reduce the superficial loading of the optical surfaces. In the case of the lenses of the third lens group LG3, the negative meniscus lens 19 has substantially been replaced by a biconcave negative lens 119 that is seated closer to the location of X of smallest constriction.

As in the case of the embodiment in accordance with FIG. 1, the fourth lens group is introduced by an object-side concave positive meniscus 121 with an aspheric entrance surface. Following thereafter in the fourth lens group are a biconvex positive lens 122 with an aspheric entrance surface, a double spherical, biconvex positive lens 123 and a positive meniscus 124, arranged immediately upstream of the system diaphragm 5, with a weakly positive refractive power. The positive meniscus lens 124 is seated in the weakly divergent beam path upstream of the diaphragm, and has an object-side concave surface at which relatively high incidence angles that support the correction occur.

The fifth lens group LG5 comprises five positive lenses 125, 126, 127, 128 and 129. An entrance-side biconvex lens 125 with an aspheric exit surface projects into the region of the system diaphragm 5. Following thereupon are three positive meniscus lenses 126, 127 and 128 concave relative to the image plane, the exit surfaces of the two last-named lenses 127, 128 being aspheric. A planoconvex lens 129 with a spherical entrance surface and planar exit surface terminates the system on the image side.

An aperture stop of adjustable diaphragm diameter in this system can be designed as a spherical diaphragm in order to avoid contact with the entrance side of the biconvex lens 125 during stopping down. Alternatively, an axially movable, if appropriate planar diaphragm can be used.

As with the embodiment in accordance with FIG. 1, only five negative lenses are provided, these being concentrated into two groups (input group 111, 112 and lens group LG3). Consequently, it is only at three sites that a change takes place between different signs of the refractive power. Only positive lenses lie between the entrance surface E of the fourth lens group and the image plane, and so the rays are recombined very efficiently downstream of the waist in the direction of the image plane, and the lens diameters can be kept moderate. Despite the very high numerical aperture of NA=1.1, the number of the lenses is relatively low at 20, a compact design with optimized mass thereby being achieved.

Figure 3:
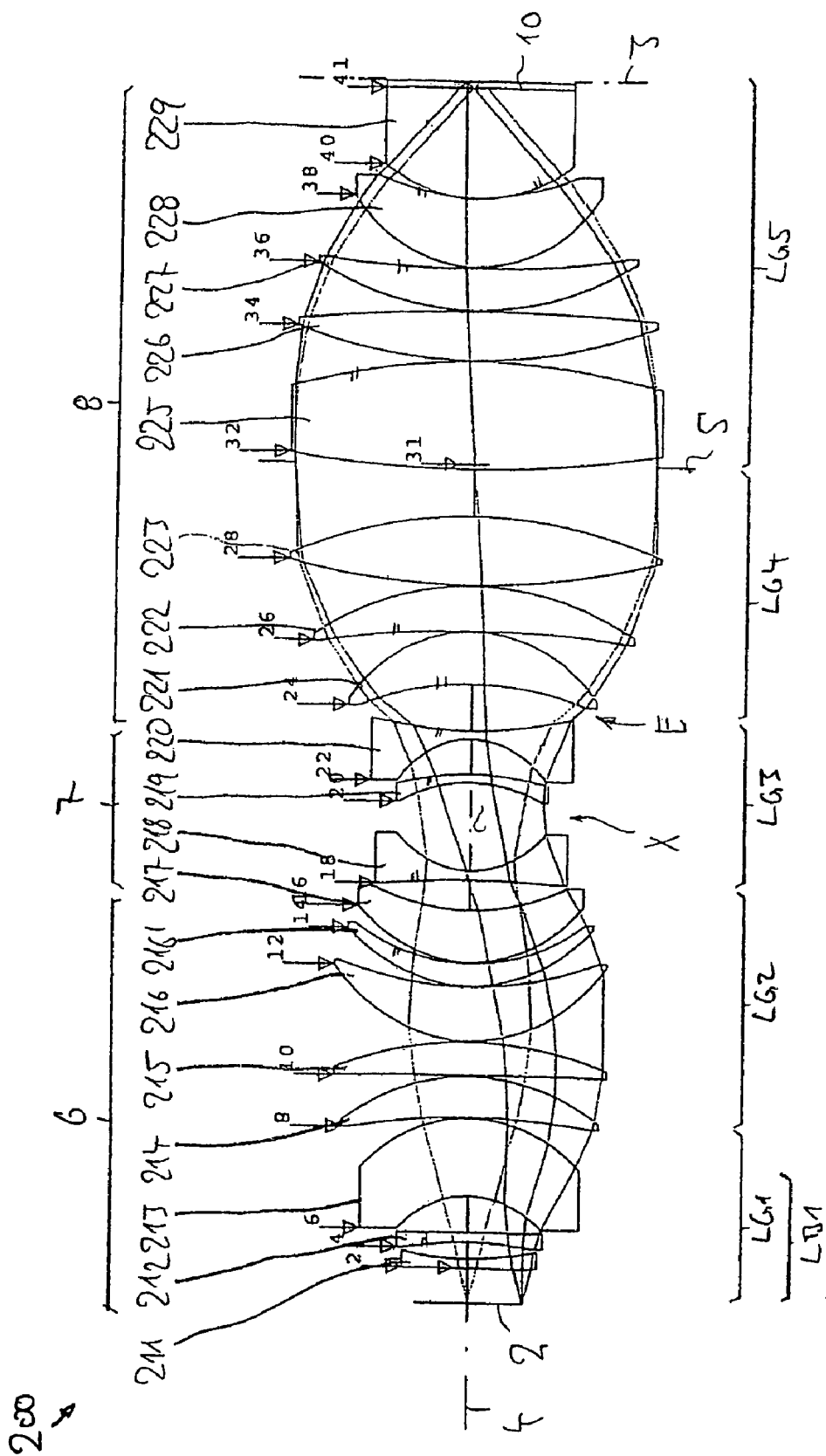
FIG. 3 is a lens section through a third embodiment of a projection objective which is designed for an operating wavelength of 193 nm.

Shown in FIG. 3 is a third embodiment of an inventive projection objective, which constitutes a variant of the first or second embodiments. In this case, the features of the basic design are denoted by the same reference symbols as in FIGS. 1 and 2. The system has an image-side numerical aperture NA=1.1. The specification of the design is given in tables 5 and 6.

The design of the first lens group LG1 and the second lens group LG2 corresponds substantially to the embodiment in accordance with FIG. 2. Reference is made to the description there. By contrast with the embodiment in accordance with FIG. 2, the entrance surface of the biconcave meniscus lens 218 is aspheric in the case of the lenses of the third lens group LG3. The subsequent negative lens 219 is fashioned as a meniscus with an object-side concave surface and aspheric exit surface, and is seated, as in the embodiment in FIG. 1, at a distance downstream of the waist X.

The design of the fourth lens group LG4 corresponds with reference to the type and the sequence of the lenses to the design of the first embodiment in accordance with FIG. 1, and so reference is made to the description there. By contrast to the lens group LG4 there, however, the entrance side of the middle positive lens 222 of this lens group is aspheric.

The fifth lens group LG2 comprises five positive lenses 225, 226, 227, 228, 229. The entrance side, thick biconvex lens 225 with an aspheric exit surface projects into the region of the system diaphragm 5 such that a spherical diaphragm or an axially displaceable aperture stop, for example, is provided here. Following downstream is the double spherical biconvex positive lens 226. This is followed by two positive meniscus lenses 227 and 228 that are concave relative to the image plane and whose entrance surfaces are spherical and whose exit surfaces are aspheric. A planoconvex lens 229 with an aspheric entrance surface and planar exit surface terminates the system on the image side.

A particular feature of this system by comparison to the other systems consists in that the diameter of the object-side first belly is much smaller than the diameter of the image-side second belly 8. The result of this in the region of the entrance surface E of the fourth lens group is a particularly strong beam divergence with high incidence angles effective in correction, above all at the aspheric exit of the negative lens 220. The ratio between the maximum diameter of the second belly and the maximum diameter of the first belly is closely connected to the color correction of the system. The smaller the diameter of the first belly, the better is the correction of the transverse chromatic aberration. In this embodiment, this ratio is approximately 1.37, a good correction of the chromatic aberration being achieved as a result.

Figure 4:
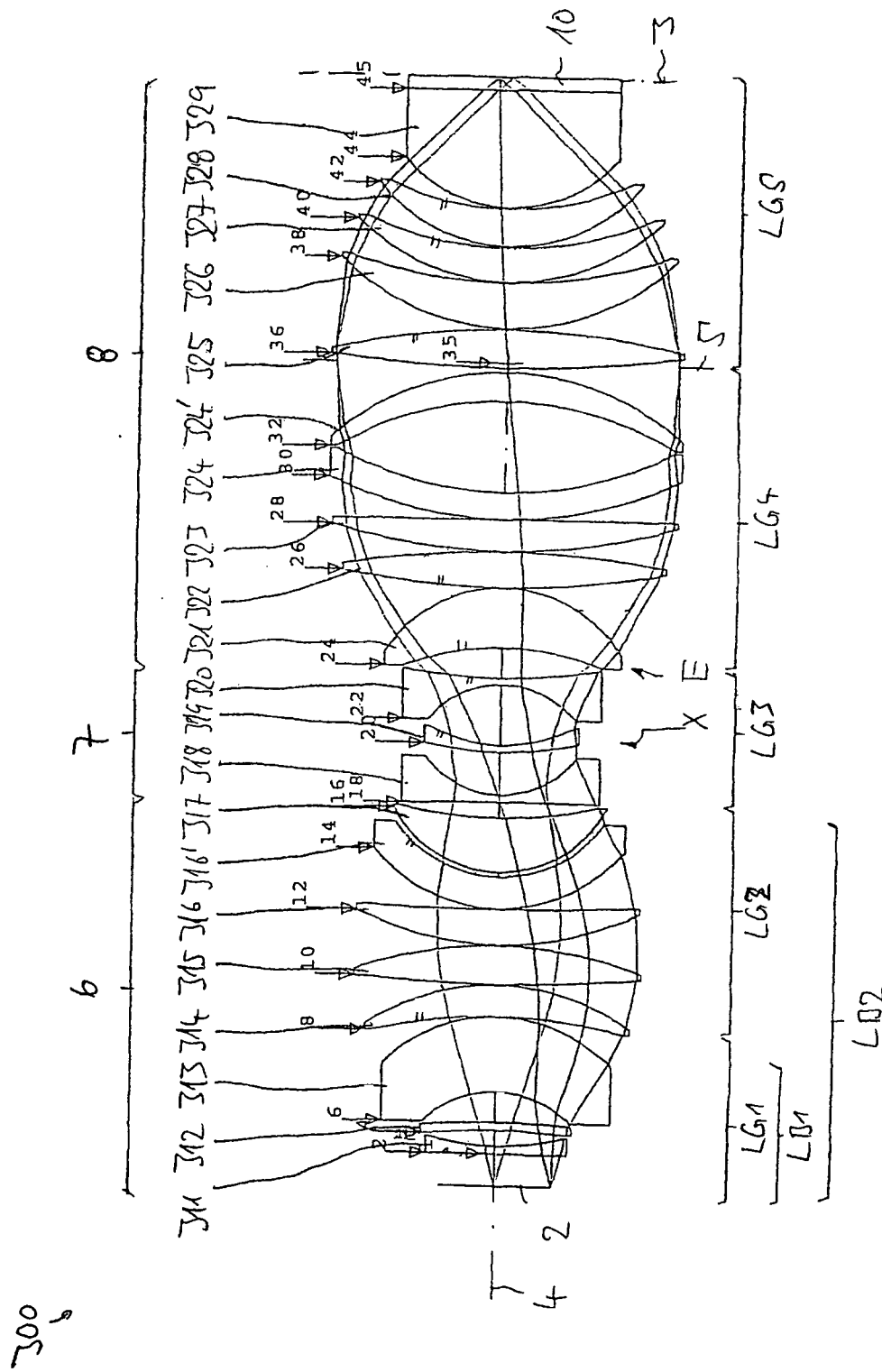
FIG. 4 is a lens section through a fourth embodiment of a projection objective which is designed for an operating wavelength of 193 nm.

A fourth embodiment is explained with the aid of FIG. 4. Here, the features of the basic design are denoted by identical reference symbols as in the case of the previous embodiments. The system has an image-side numerical aperture NA=1.1. The specification of this design is given in tables 7 and 8.

The design of the first lens group LG1 and the second lens group LG2 corresponds substantially to that of the third embodiment or the second embodiment, and so reference may be made to the description there. The differences exist chiefly in the design of the output-side lenses 316, 316' and 317 of LG2. Although, as in the case of the embodiment in accordance with FIG. 3, these lenses are designed as positive meniscus lenses with image-side concave surfaces, the bending differs from that of the other embodiments. The positive lens 316 has a spherical entrance surface and an only weakly curved, concave exit surface. It is followed by a strongly curved meniscus 316' of very weak refractive power and by an aspheric exit side. This is followed with a slight air separation by the convex, spherical entrance surface, curved in the same sense, of the meniscus 317, which has a concave, spherical exit surface.

Inside the third lens group LG3, the middle negative lens 319 there is formed by a meniscus that is concave on the image side and has an aspheric exit surface, and which is seated in the immediate vicinity of the site X of smallest constriction.

As in the case of the other embodiments, the transition between the third and fourth lens groups is formed by a strongly correcting lens doublet 320, 321 with mutually facing, aspheric concave surfaces in the region of which high incidence angles occur.

Following the positive meniscus 321, which is convex on the image side, inside the fourth lens group is a biconvex positive lens 322 with an aspheric entrance side, a double spherical biconvex positive lens 323 with a virtually planar exit surface, a meniscus 324, concave relative to the image plane, of weakly negative refractive power ($-0.11 \text{ m}^{-1}$), and a thin, double spherical positive meniscus 324', with an object-side concave surface. The mutually facing concave surfaces of the meniscuses 324, 324' enclose a biconvex air lens in the region of which there lies a small constriction of the beam path. Spherical aberration and coma are corrected substantially more easily as a result, and so the diameter of the second belly can be reduced.

With reference to the type of lenses, the design of the fifth group LG5 downstream of the system diaphragm 5 corresponds fundamentally to the embodiment in accordance with FIG. 2, and so reference is made to the description there.

In a particular configuration of the lenses in the output region of the first belly and, in particular, the oppositely curved meniscuses 324, 324' of weak refractive power immediately upstream of the system diaphragm provide novel correction means that enable the maximum diameter of the lenses of this system to be substantially reduced by comparison with the previous embodiments. A compact design of low mass is thereby promoted.

Figure 5:
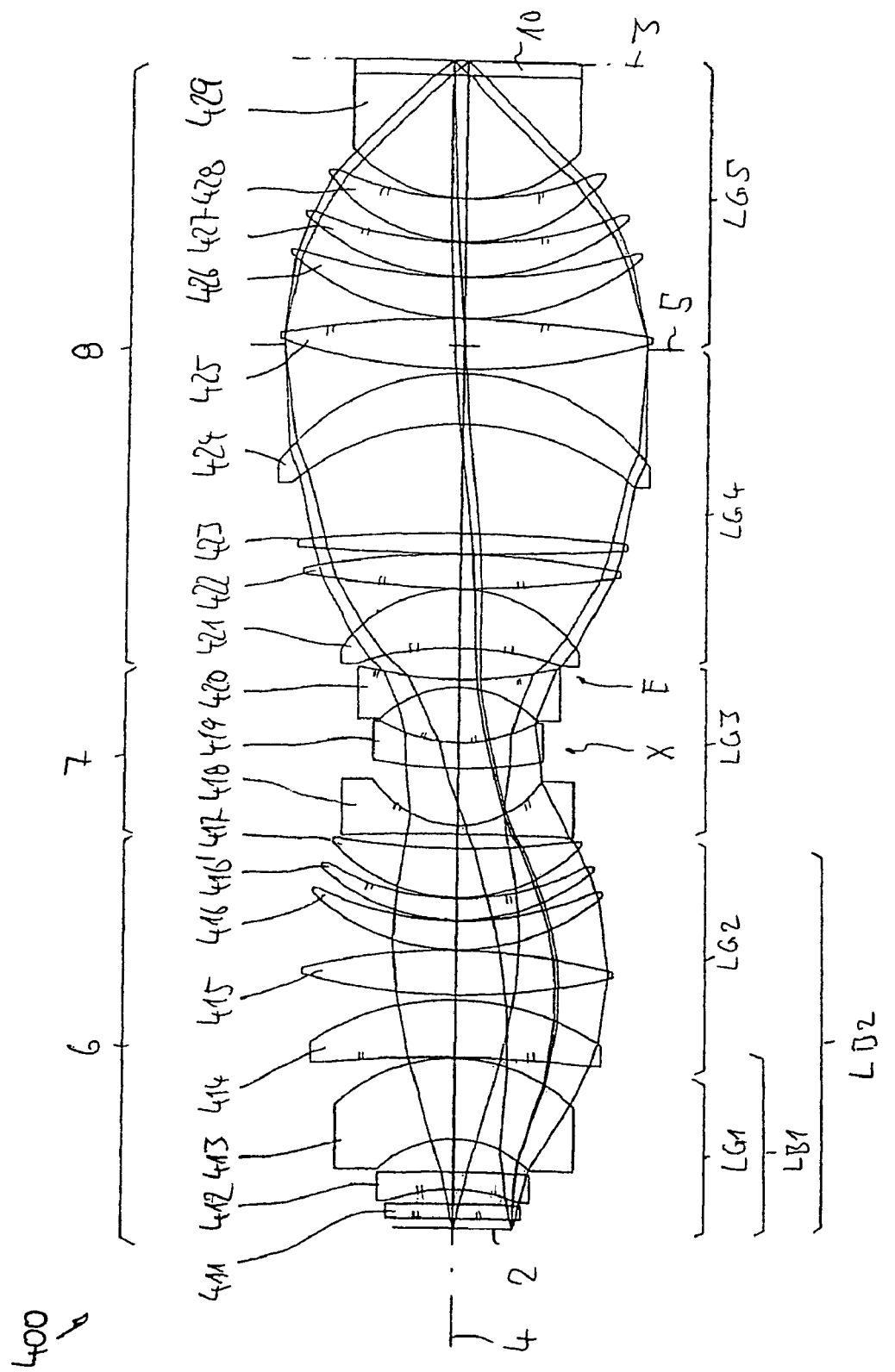
FIG. 5 is a lens section through a fifth embodiment of a projection objective which is designed for an operating wavelength of 193 nm.

A variant of the second embodiment shown in FIG. 2 is explained with the aid of FIG. 5. Here, the features of the basic design are denoted by the same reference symbols as in FIG. 2, the reference symbols for the lenses being increased by 300 in each case. The type and sequence of the lenses do not differ from the embodiment in accordance with FIG. 2, and so reference is made to this extent to the description there. The specification of this design is given in tables 9 and 10.

By contrast with this design in accordance with FIG. 2, in the projection objective 400 the input-side lenses 411, 412 are of slightly thicker configuration, likewise the middle lens 419 of the third lens group LG3, which is configured here as a negative meniscus with an image-side concave surface.

A particular feature of this system is a substantially smaller working distance in the object space. This amounts here for an object field diameter of approximately 112 mm to only 9.14 mm (instead of 32 mm for the second embodiment). (The object field diameter of the objective can be taken in each case from the tables as twice the free radius (½ diameter) of the surface No. 0). The correcting influence of the first lens group LG1 on the field curvature is intensified by the smaller object-side working distance. This enables a particularly stress-relieved design of the third lens group LG3 with simultaneous reduction in the aberration contribution. Moreover, the telecentrism and distortion can be more effectively corrected. The system in accordance with FIG. 5 is generally more stress-relieved and has improved corrigibility by comparison with the system in accordance with FIG. 2. It has emerged that values for the object-side working distance of between approximately 5 mm and approximately 25% up to approximately 50% of the object field diameter are particularly favorable. For values below 5 mm, the requirements placed on the surface quality and the material quality, in particular with reference to striations, of the first lens elements rise sharply. The advantage reduces in the event of relatively large working distances.

The use of the object back focus distance (object-side working distance) as correcting means can be explained in the following fashion: on the one hand, the reduction in the object back focus distance intensifies the influence of the first lens group of negative refractive power on the field curvature. This permits a stress-relieved design of the third lens group (waist), with simultaneous reduction in its aberration contributions. On the other hand, the telecentrism and the distortion can be more strongly influenced and thereby corrected. A certain separation of telecentrism correction and distortion correction is possible.

A short working distance in the object space permits not only the front lenses to come closer to the object, but also the aspheres, which are borne by the latter. This additionally intensifies their correcting action on the field-dependent aberrations.

The minimum working distance should be set such that the subapertures on the front asphere are sufficiently large that the specification of the surface quality can still be accommodated in the aberration budget.

Such short object-side working distances can be useful in the case of all high-aperture lithography projection objectives, for example with image-side numerical apertures from approximately NA=0.8 (dry) up to the immersion objectives, shown in the examples, with NA=1.1 or greater (currently up to NA=1.3). This holds, in particular, whenever the object-side working distance lies below 20 mm or even below 10 mm. Restrictions placed on the free design space for reticle handling are usually not so high-ranking as the achievable advantages in optical correction with such high apertures.

Figure 6:
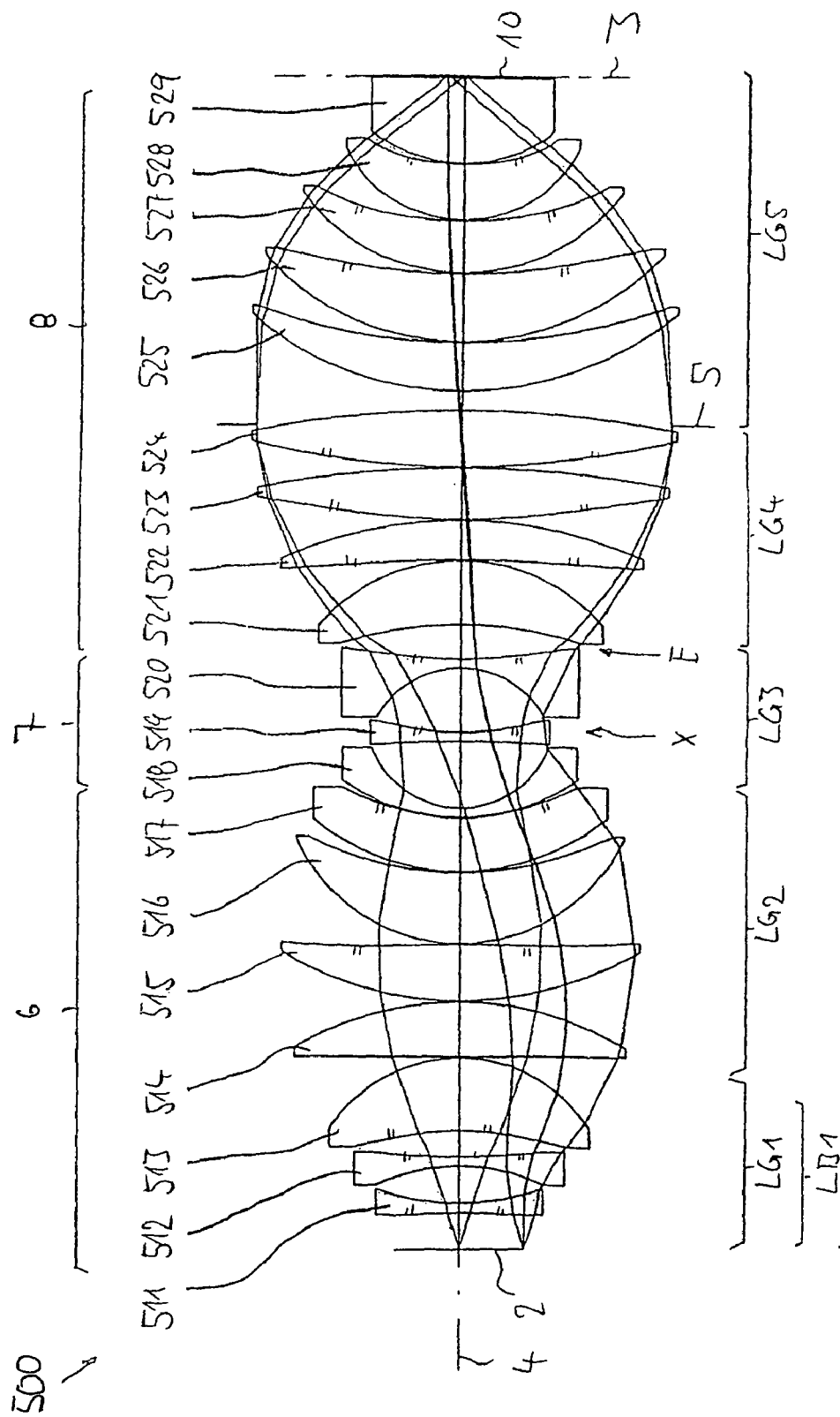
FIG. 6 is a lens section through a sixth embodiment of a projection objective which is designed for an operating wavelength of 193 nm.

A variant of the first embodiment shown in FIG. 1 is explained with the aid of FIG. 6. Here, the features of the basic design are denoted by the same reference symbols as in FIG. 1. The lenses bear corresponding reference symbols, increased by 500. The specification of this design is given in tables 11 and 12.

By contrast with the embodiment in accordance with FIG. 1, the fourth lens 514, following the object plane, is not configured as a positive meniscus, but virtually as a plano-convex lens. The middle lens 519 of the third lens group is seated in the middle between the adjacent negative lenses and is not configured as a meniscus lens, but as a biconcave lens. All the lens elements downstream of the system diaphragm 5 are fashioned as positive meniscus lenses with an image-side concave surface. The diameters in the second belly thereby become smaller, and at the same time the system diaphragm is provided with a larger movement space. A substantial difference from the embodiment in accordance with FIG. 1 is the very small working distance in the image space, which amounts here only to 1.73 mm (by contrast with approximately 13 mm in FIG. 1). Transmission problems in the immersion medium are thereby reduced.

The invention also relates to a projection exposure machine for microlithography that is distinguished in that it includes a refractive projection objective in accordance with the invention. The projection exposure machine preferably also has devices for introducing and holding an immersion medium, for example a liquid of suitable refractive index, between the last optical surface of the projection objective and the substrate to be exposed. Also comprised is a method for producing semiconductor components and other finely structured components in the case of which an image of a pattern arranged in the object plane of a projection objective is imaged in the region of the image plane, an immersion medium that is arranged between the projection objective and the substrate to be exposed and is transparent to light of the operating wavelength being transirradiated.

TABLE 1

| SURFACE | RADII | | THICKNESS | MATERIAL | INDEX | ½ DIA. |
|---|---|---|---|---|---|---|
| 0 | 0.000000000 | | 32.000000000 | LUFTV193 | 1.00030168 | 56.080 |
| 1 | 0.000000000 | | 0.000000000 | LUFTV193 | 1.00030168 | 64.285 |
| 2 | −865.050540254 | AS | 8.000000000 | SIO2V | 1.56078570 | 64.285 |
| 3 | 290.818451556 | | 12.977949377 | N2VP950 | 1.00029966 | 66.587 |
| 4 | −785.540458496 | AS | 8.000000000 | SIO2V | 1.56078570 | 67.984 |
| 5 | 993.943579336 | | 32.783966724 | N2VP950 | 1.00029966 | 70.962 |
| 6 | −111.758943889 | | 84.059022555 | SIO2V | 1.56078570 | 72.541 |
| 7 | −157.792863838 | | 1.000000000 | N2VP950 | 1.00029966 | 110.623 |
| 8 | −976.343592324 | AS | 29.745781546 | SIO2V | 1.56078570 | 126.319 |
| 9 | −302.211713385 | | 1.000000000 | N2VP950 | 1.00029966 | 128.519 |
| 10 | 861.145865697 | | 39.130890181 | SIO2V | 1.56078570 | 135.470 |
| 11 | −462.739285409 | | 1.000000000 | N2VP950 | 1.00029966 | 135.872 |
| 12 | 170.741772483 | | 84.048926757 | SIO2V | 1.56078570 | 128.315 |
| 13 | 271.206057493 | AS | 1.000000000 | N2VP950 | 1.00029966 | 107.756 |
| 14 | 136.915825828 | | 48.838558347 | SIO2V | 1.56078570 | 99.678 |
| 15 | 213.245426279 | | 25.207226449 | N2VP950 | 1.00029966 | 85.576 |
| 16 | −918.293529854 | | 8.000000000 | SIO2V | 1.56078570 | 83.141 |
| 17 | 95.947147465 | | 88.880628458 | N2VP950 | 1.00029966 | 68.943 |
| 18 | −114.002344853 | | 8.000000000 | SIO2V | 1.56078570 | 68.191 |
| 19 | −193.441060843 | AS | 18.779522128 | N2VP950 | 1.00029966 | 72.266 |
| 20 | −108.981149024 | | 8.000000000 | SIO2V | 1.56078570 | 72.928 |
| 21 | 337.229009012 | AS | 34.264924267 | N2VP950 | 1.00029966 | 90.855 |
| 22 | −378.436104518 | AS | 41.010541982 | SIO2V | 1.56078570 | 99.638 |
| 23 | −163.510794786 | | 1.000000000 | N2VP950 | 1.00029966 | 109.697 |
| 24 | −1048.483558130 | | 48.106157417 | SIO2V | 1.56078570 | 131.422 |
| 25 | −212.098893173 | | 1.000000000 | N2VP950 | 1.00029966 | 134.785 |
| 26 | 455.564493212 | | 38.863091168 | SIO2V | 1.56078570 | 151.792 |
| 27 | −2411.753669630 | | 9.000000000 | N2VP950 | 1.00029966 | 151.861 |
| 28 | 0.000000000 | | 0.000000000 | N2VP950 | 1.00029966 | 151.670 |
| 29 | 0.000000000 | | 1.000000000 | N2VP950 | 1.00029966 | 151.732 |
| 30 | 396.383711792 | | 20.855290362 | SIO2V | 1.56078570 | 154.881 |
| 31 | 692.061959851 | AS | 53.642541173 | N2VP950 | 1.00029966 | 154.181 |
| 32 | −27619.070745400 | | 37.463229296 | SIO2V | 1.56078570 | 154.778 |
| 33 | −416.737141814 | | 1.000000000 | N2VP950 | 1.00029966 | 154.883 |
| 34 | 208.730269126 | | 50.922368160 | SIO2V | 1.56078570 | 136.985 |
| 35 | 1250.936698020 | AS | 1.000000000 | N2VP950 | 1.00029966 | 133.556 |
| 36 | 149.168582835 | | 54.192578417 | SIO2V | 1.56078570 | 109.143 |
| 37 | 195.589235389 | AS | 1.000000000 | N2VP950 | 1.00029966 | 87.757 |
| 38 | 133.474284291 | | 100.901991415 | SIO2V | 1.56078570 | 81.472 |
| 39 | 0.000000000 | | 6.000000000 | H2OV | 1.43636732 | 19.897 |
| 40 | 0.000000000 | | −0.000005061 | | 1.00000000 | 14.020 |

TABLE 2

ASPHERIC CONSTANTS

SURFACE NO. 2

| K | 0.0000 |
|---|---|
| C1 | 2.22079559e−007 |
| C2 | −2.64018719e−011 |
| C3 | 2.50852766e−015 |
| C4 | −3.25400366e−019 |

TABLE 2-continued

ASPHERIC CONSTANTS

| C5 | 3.53141037e−023 |
|---|---|
| C6 | −2.57029540e−027 |
| C7 | 0.00000000e+000 |
| C8 | 0.00000000e+000 |
| C9 | 0.00000000e+000 |

TABLE 2-continued

ASPHERIC CONSTANTS

SURFACE NO. 4

| K | 0.0000 |
|---|---|
| C1 | 7.87748495e−009 |
| C2 | 1.51301853e−011 |
| C3 | −1.45712594e−015 |
| C4 | 1.23713065e−019 |

TABLE 2-continued

ASPHERIC CONSTANTS

| | |
|---|---|
| C5 | −1.06714221e−023 |
| C6 | 9.37529787e−028 |
| C7 | 0.00000000e+000 |
| C8 | 0.00000000e+000 |
| C9 | 0.00000000e+000 |
| SURFACE NO. 8 | |
| K | 0.0000 |
| C1 | 1.15089618e−009 |
| C2 | 1.75526288e−013 |
| C3 | 5.50342306e−018 |
| C4 | −5.03060695e−023 |
| C5 | −3.74390222e−027 |
| C6 | 2.35013568e−032 |
| C7 | 0.00000000e+000 |
| C8 | 0.00000000e+000 |
| C9 | 0.00000000e+000 |
| SURFACE NO. 13 | |
| K | 0.0000 |
| C1 | 5.69048541e−009 |
| C2 | 2.22660165e−013 |
| C3 | 5.06834768e−019 |
| C4 | −5.28569590e−022 |
| C5 | −7.86940964e−027 |
| C6 | −2.04428899e−031 |
| C7 | 0.00000000e+000 |
| C8 | 0.00000000e+000 |
| C9 | 0.00000000e+000 |
| SURFACE NO. 19 | |
| K | 0.0000 |
| C1 | 3.73796256e−008 |
| C2 | −3.23750168e−012 |
| C3 | −2.99948447e−016 |
| C4 | −1.26432681e−020 |
| C5 | −1.99316836e−024 |
| C6 | 2.17020495e−028 |
| C7 | 0.00000000e+000 |
| C8 | 0.00000000e+000 |
| C9 | 0.00000000e+000 |
| SURFACE NO. 21 | |
| K | 0.0000 |
| C1 | −4.47941204e−008 |
| C2 | 1.91031010e−012 |
| C3 | −6.87449830e−017 |
| C4 | 3.10021117e−021 |
| C5 | −2.27317966e−025 |
| C6 | 7.02595515e−030 |
| C7 | 0.00000000e+000 |

TABLE 2-continued

ASPHERIC CONSTANTS

| | |
|---|---|
| C8 | 0.00000000e+000 |
| C9 | 0.00000000e+000 |
| SURFACE NO. 22 | |
| K | 0.0000 |
| C1 | −2.17284274e−008 |
| C2 | 2.24196148e−013 |
| C3 | −5.21041812e−018 |
| C4 | −9.18268284e−023 |
| C5 | 3.33452899e−027 |
| C6 | 1.17805194e−030 |
| C7 | 0.00000000e+000 |
| C8 | 0.00000000e+000 |
| C9 | 0.00000000e+000 |
| SURFACE NO. 31 | |
| K | 0.0000 |
| C1 | 4.34168273e−010 |
| C2 | 6.79894644e−014 |
| C3 | 8.53259806e−019 |
| C4 | −3.70631658e−023 |
| C5 | 9.42929641e−028 |
| C6 | −9.21609297e−033 |
| C7 | 0.00000000e+000 |
| C8 | 0.00000000e+000 |
| C9 | 0.00000000e+000 |
| SURFACE NO. 35 | |
| K | 0.0000 |
| C1 | −4.95304387e−010 |
| C2 | 3.68346595e−013 |
| C3 | −1.14699839e−017 |
| C4 | 3.56713006e−022 |
| C5 | −8.33238537e−027 |
| C6 | 1.16876976e−031 |
| C7 | 0.00000000e+000 |
| C8 | 0.00000000e+000 |
| C9 | 0.00000000e+000 |
| SURFACE NO. 37 | |
| K | 0.0000 |
| C1 | 6.27172010e−009 |
| C2 | 4.74147771e−013 |
| C3 | 6.99599832e−017 |
| C4 | −8.95486009e−022 |
| C5 | 7.42088130e−026 |
| C6 | 1.36162977e−029 |
| C7 | 0.00000000e+000 |
| C8 | 0.00000000e+000 |
| C9 | 0.00000000e+000 |

TABLE 3

| SURFACE | RADII | | THICKNESS | MATERIAL | INDEX | ½ DIA. |
|---|---|---|---|---|---|---|
| 0 | 0.000000000 | | 32.000000000 | LUFTV193 | 1.00030168 | 56.080 |
| 1 | 0.000000000 | | 0.000000000 | LUFTV193 | 1.00030168 | 65.329 |
| 2 | −862.369062961 | AS | 7.338632000 | SIO2V | 1.56078570 | 65.329 |
| 3 | 1729.160869900 | | 8.274822683 | N2VP950 | 1.00029966 | 66.763 |
| 4 | −447.956682044 | AS | 7.338632000 | SIO2V | 1.56078570 | 67.694 |
| 5 | 395.435201480 | | 39.423033814 | N2VP950 | 1.00029966 | 71.219 |
| 6 | −103.758498877 | | 72.684309488 | SIO2V | 1.56078570 | 72.711 |
| 7 | −154.563177595 | | 0.917329000 | N2VP950 | 1.00029966 | 108.819 |
| 8 | −780.383884859 | AS | 32.249416462 | SIO2V | 1.56078570 | 125.591 |
| 9 | −256.700260496 | | 0.917329000 | N2VP950 | 1.00029966 | 127.994 |
| 10 | 890.876055318 | | 40.079600210 | SIO2V | 1.56078570 | 137.132 |
| 11 | −439.438418565 | | 0.917329000 | N2VP950 | 1.00029966 | 137.633 |
| 12 | 174.112406867 | | 37.588836160 | SIO2V | 1.56078570 | 131.138 |
| 13 | 294.417657706 | | 0.917329000 | | 1.00000000 | 128.131 |
| 14 | 193.947508268 | | 19.661875223 | SIO2V | 1.56078570 | 122.533 |
| 15 | 254.407260784 | AS | 0.917329000 | N2VP950 | 1.00029966 | 118.763 |
| 16 | 150.175439934 | | 46.836170975 | SIO2V | 1.56078570 | 110.351 |
| 17 | 634.351476536 | | 12.890800996 | N2VP950 | 1.00029966 | 105.519 |

TABLE 3-continued

| SURFACE | RADII | | THICKNESS | MATERIAL | INDEX | ½ DIA. |
|---|---|---|---|---|---|---|
| 18 | −6207.994384690 | | 7.338632000 | SIO2V | 1.56078570 | 101.889 |
| 19 | 89.325322950 | | 57.391056746 | N2VP950 | 1.00029966 | 75.356 |
| 20 | 4999.526146000 | | 7.338632000 | SIO2V | 1.56078570 | 73.134 |
| 21 | 179.724355387 | AS | 48.429517423 | N2VP950 | 1.00029966 | 71.160 |
| 22 | −99.598077900 | | 7.338632000 | SIO2V | 1.56078570 | 71.490 |
| 23 | 303.140682220 | AS | 29.505975384 | N2VP950 | 1.00029966 | 91.187 |
| 24 | −370.484993955 | AS | 59.205322959 | SIO2V | 1.56078570 | 95.002 |
| 25 | −136.850476930 | | 0.917329000 | N2VP950 | 1.00029966 | 109.198 |
| 26 | 833.250243086 | AS | 32.644361706 | SIO2V | 1.56078570 | 144.418 |
| 27 | −773.094655176 | | 0.917329000 | N2VP950 | 1.00029966 | 146.324 |
| 28 | 2441.087142480 | | 19.909286963 | SIO2V | 1.56078570 | 152.142 |
| 29 | −1510.264560440 | | 88.047728958 | N2VP950 | 1.00029966 | 153.326 |
| 30 | −249.859723486 | | 48.358305705 | SIO2V | 1.56078570 | 160.594 |
| 31 | −214.008029106 | | 24.481325311 | N2VP950 | 1.00029966 | 169.839 |
| 32 | 0.000000000 | | 0.000000000 | N2VP950 | 1.00029966 | 169.727 |
| 33 | 0.000000000 | | −19.902925311 | N2VP950 | 1.00029966 | 170.008 |
| 34 | 605.505698754 | | 44.392798544 | SIO2V | 1.56078570 | 170.298 |
| 35 | −1225.711846280 | AS | 0.917329000 | N2VP950 | 1.00029966 | 170.093 |
| 36 | 268.380703332 | | 42.756143122 | SIO2V | 1.56078570 | 162.321 |
| 37 | 673.253223882 | | 0.917329000 | N2VP950 | 1.00029966 | 159.910 |
| 38 | 227.991051127 | | 32.036009978 | SIO2V | 1.56078570 | 146.725 |
| 39 | 386.401662820 | AS | 0.917329000 | N2VP950 | 1.00029966 | 142.860 |
| 40 | 162.089277636 | | 39.331357629 | SIO2V | 1.55078570 | 125.201 |
| 41 | 280.403904868 | AS | 0.261317709 | N2VP950 | 1.00029966 | 119.607 |
| 42 | 140.568776863 | | 116.047901278 | SIO2V | 1.56078570 | 102.577 |
| 43 | 0.000000000 | | 13.799062914 | H2OV | 1.43636732 | 30.675 |
| 44 | 0.000000000 | | −0.000004642 | | 1.00000000 | 14.021 |

TABLE 4

ASPHERIC CONSTANTS

SURFACE NO. 2

| K | 0.0000 |
|---|---|
| C1 | 2.19548056e−007 |
| C2 | −2.55904121e−011 |
| C3 | 2.12575595e−015 |
| C4 | −2.50297943e−019 |
| C5 | 3.13467504e−023 |
| C6 | −2.79504784e−027 |
| C7 | 0.00000000e+000 |
| C8 | 0.00000000e+000 |
| C9 | 0.00000000e+000 |

SURFACE NO. 4

| K | 0.0000 |
|---|---|
| C1 | 1.21102797e−008 |
| C2 | 1.76786393e−011 |
| C3 | −1.87389050e−015 |
| C4 | 1.72877663e−019 |
| C5 | −1.98845633e−023 |
| C6 | 1.78566034e−027 |
| C7 | 0.00000000e+000 |
| C8 | 0.00000000e+000 |
| C9 | 0.00000000e+000 |

SURFACE NO. 8

| K | 0.0000 |
|---|---|
| C1 | −9.80034077e−010 |
| C2 | 2.46895064e−013 |
| C3 | 4.48590254e−018 |
| C4 | −1.11608746e−022 |
| C5 | −2.09316739e−028 |
| C6 | −1.30605266e−032 |
| C7 | 0.00000000e+000 |
| C8 | 0.00000000e+000 |
| C9 | 0.00000000e+000 |

SURFACE NO. 15

| K | 0.0000 |
|---|---|
| C1 | 6.09055369e−009 |
| C2 | 2.84395774e−013 |

TABLE 4-continued

ASPHERIC CONSTANTS

| C3 | −7.49910993e−019 |
|---|---|
| C4 | −1.80830244e−022 |
| C5 | 3.10893772e−027 |
| C6 | −2.97216228e−031 |
| C7 | 0.00000000e+000 |
| C8 | 0.00000000e+000 |
| C9 | 0.00000000e+000 |

SURFACE NO. 21

| K | 0.0000 |
|---|---|
| C1 | 1.32575347e−008 |
| C2 | 8.58331790e−013 |
| C3 | −1.94468414e−016 |
| C4 | −1.29822097e−020 |
| C5 | −1.77617526e−024 |
| C6 | −5.15388789e−029 |
| C7 | 0.00000000e+000 |
| C8 | 0.00000000e+000 |
| C9 | 0.00000000e+000 |

SURFACE NO. 23

| K | 0.0000 |
|---|---|
| C1 | −1.18145642e−008 |
| C2 | −2.83190683e−012 |
| C3 | 2.26490366e−016 |
| C4 | −6.32627810e−021 |
| C5 | −1.50743622e−025 |
| C6 | 8.70173390e−030 |
| C7 | 0.00000000e+000 |
| C8 | 0.00000000e+000 |
| C9 | 0.00000000e+000 |

SURFACE NO. 24

| K | 0.0000 |
|---|---|
| C1 | −3.01246654e−008 |
| C2 | 1.06355654e−012 |
| C3 | 2.64650202e−017 |
| C4 | −5.31683508e−022 |
| C5 | 7.81208963e−026 |
| C6 | 3.39162041e−031 |
| C7 | 0.00000000e+000 |

TABLE 4-continued

ASPHERIC CONSTANTS

| | |
|---|---|
| C8 | 0.00000000e+000 |
| C9 | 0.00000000e+000 |
| SURFACE NO. 26 | |
| K | 0.0000 |
| C1 | −4.05454064e−010 |
| C2 | −9.90878824e−014 |
| C3 | −3.34054558e−018 |
| C4 | 1.64085791e−022 |
| C5 | −3.65955875e−027 |
| C6 | 2.72435876e−032 |
| C7 | 0.00000000e+000 |
| C8 | 0.00000000e+000 |
| C9 | 0.U0000000e+000 |
| SURFACE NO. 35 | |
| K | 0.0000 |
| C1 | −3.08382689e−009 |
| C2 | 1.05186842e−013 |
| C3 | −1.54488832e−018 |
| C4 | 2.62389724e−023 |
| C5 | −3.61488247e−028 |
| C6 | 3.85542172e−033 |
| C7 | 0.00000000e+000 |
| C8 | 0.00000000e+000 |
| C9 | 0.00000000e+000 |

TABLE 4-continued

ASPHERIC CONSTANTS

| | |
|---|---|
| SURFACE NO. 39 | |
| K | 0.0000 |
| C1 | 1.07703763e−009 |
| C2 | 3.77796386e−014 |
| C3 | 6.64204598e−018 |
| C4 | −2.44938953e−022 |
| C5 | 6.79537323e−027 |
| C6 | −7.97331309e−032 |
| C7 | 0.00000000e+000 |
| C8 | 0.00000000e+000 |
| C9 | 0.00000000e+000 |
| SURFACE NO. 41 | |
| K | 0.0000 |
| C1 | 7.20956318e−009 |
| C2 | −4.70255323e−013 |
| C3 | 4.99805454e−018 |
| C4 | 3.18969937e−022 |
| C5 | −1.99338016e−026 |
| C6 | 4.74226957e−031 |
| C7 | 0.00000000e+000 |
| C8 | 0.00000000e+000 |
| C9 | 0.00000000e+000 |

TABLE 5

| SURFACE | RADII | | THICKNESS | MATERIAL | INDEX | ½ DIA. |
|---|---|---|---|---|---|---|
| 0 | 0.000000000 | | 32.000000000 | LUFTV193 | 1.00030168 | 56.080 |
| 1 | 0.000000000 | | 0.000000000 | LUFTV193 | 1.00030168 | 65.155 |
| 2 | −1048.799448010 | AS | 8.000000000 | SIO2V | 1.56078570 | 65.155 |
| 3 | 357.466074350 | | 15.577785773 | N2VP950 | 1.00029966 | 67.527 |
| 4 | −333.124141019 | AS | 8.000000000 | SIO2V | 1.56078570 | 68.924 |
| 5 | −6820.155766490 | | 32.518686615 | N2VP950 | 1.00029966 | 72.732 |
| 6 | −108.770146111 | | 70.263717141 | SIO2V | 1.56078570 | 74.375 |
| 7 | −162.558742016 | | 1.000000000 | N2VP950 | 1.00029966 | 109.658 |
| 8 | −727.250432030 | AS | 36.345994520 | SIO2V | 1.56078570 | 125.724 |
| 9 | −234.557132237 | | 1.000000000 | N2VP950 | 1.00029966 | 128.456 |
| 10 | −9857.135615630 | | 30.073073529 | SIO2V | 1.56078570 | 135.510 |
| 11 | −416.488132376 | | 1.000000000 | N2VP950 | 1.00029966 | 136.485 |
| 12 | 177.128692467 | | 48.877488263 | SIO2V | 1.56078570 | 136.329 |
| 13 | 394.792585911 | | 1.000000000 | | 1.00000000 | 133.281 |
| 14 | 177.767357652 | | 20.430936240 | SIO2V | 1.56078570 | 122.702 |
| 15 | 218.676264170 | AS | 1.000000000 | N2VP950 | 1.00029966 | 118.151 |
| 16 | 155.471795544 | | 47.586544113 | SIO2V | 1.56078570 | 112.186 |
| 17 | 242.337161267 | | 28.571587020 | N2VP950 | 1.00029966 | 98.491 |
| 18 | −759.907092606 | AS | 8.000000000 | SIO2V | 1.56078570 | 95.650 |
| 19 | 102.688590330 | | 81.578758663 | N2VP950 | 1.00029966 | 76.465 |
| 20 | −160.625087377 | | 8.000000000 | SIO2V | 1.56078570 | 73.506 |
| 21 | −289.596594758 | AS | 32.123693558 | N2VP950 | 1.00029966 | 75.482 |
| 22 | −94.386389420 | | 8.000000000 | SIO2V | 1.56078570 | 75.641 |
| 23 | 393.984728152 | AS | 43.431984001 | N2VP950 | 1.00029966 | 100.441 |
| 24 | −383.629532182 | AS | 48.428600019 | SIO2V | 1.56078570 | 115.392 |
| 25 | −159.278903132 | | 1.000000000 | N2VP950 | 1.00029966 | 123.564 |
| 26 | −1493.341508910 | AS | 41.723752694 | SIO2V | 1.56078570 | 155.895 |
| 27 | −311.773166805 | | 1.000000000 | N2VP950 | 1.00029966 | 159.465 |
| 28 | 790.204177656 | | 64.210221574 | SIO2V | 1.56078570 | 183.877 |
| 29 | −513.494438444 | | 48.508920065 | N2VP950 | 1.00029966 | 184.913 |
| 30 | 0.000000000 | | 0.000000000 | N2VP950 | 1.00029966 | 183.970 |
| 31 | 0.000000000 | | −4.679353550 | N2VP950 | 1.00029966 | 184.111 |
| 32 | 1228.823190020 | | 99.991561318 | SIO2V | 1.56078570 | 184.706 |
| 33 | −727.663147183 | AS | 1.000000000 | N2VP950 | 1.00029966 | 184.894 |
| 34 | 543.534872302 | | 45.268294559 | SIO2V | 1.56078570 | 178.330 |
| 35 | −2190.264622390 | | 1.000000000 | N2VP950 | 1.00029966 | 176.712 |
| 36 | 321.195671013 | | 38.692254682 | SIO2V | 1.56078570 | 157.822 |
| 37 | 1247.251021990 | AS | 1.000000000 | N2VP950 | 1.00029966 | 154.258 |
| 38 | 152.057533078 | | 64.095023650 | SIO2V | 1.56078570 | 121.939 |
| 39 | 242.847796060 | AS | −0.663115549 | N2VP950 | 1.00029966 | 102.223 |
| 40 | 159.282474016 | AS | 100.471918401 | SIO2V | 1.56078570 | 92.400 |
| 41 | 0.000000000 | | 6.000000000 | H2OV | 1.43636732 | 21.211 |
| 42 | 0.000000000 | | −0.000005061 | | 1.00000000 | 14.020 |

TABLE 6

| ASPHERIC CONSTANTS | |
|---|---|
| SURFACE NO. 2 | |
| K | 0.0000 |
| C1 | 1.68161638e−007 |
| C2 | −1.54096885e−011 |
| C3 | 6.84912375e−016 |
| C4 | −1.65634098e−020 |
| C5 | −4.21003140e−024 |
| C6 | −3.70097554e−029 |
| C7 | 0.00000000e+000 |
| C8 | 0.00000000e+000 |
| C9 | 0.00000000e+000 |
| SURFACE NO. 4 | |
| K | 0.0000 |
| C1 | 4.16802658e−008 |
| C2 | 7.71901817e−012 |
| C3 | −4.85374566e−016 |
| C4 | 2.38634680e−020 |
| C5 | −4.52727128e−024 |
| C6 | 7.55327461e−028 |
| C7 | 0.00000000e+000 |
| C8 | 0.00000000e+000 |
| C9 | 0.00000000e+000 |
| SURFACE NO. 8 | |
| K | 0.0000 |
| C1 | −1.03251955e−009 |
| C2 | 3.10271087e−013 |
| C3 | 9.94527633e−019 |
| C4 | −1.95266425e−024 |
| C5 | −1.31835831e−027 |
| C6 | −8.30589618e−032 |
| C7 | 0.00000000e+000 |
| C8 | 0.00000000e+000 |
| C9 | 0.00000000e+000 |
| SURFACE NO. 15 | |
| K | 0.0000 |
| C1 | 6.90734885e−009 |
| C2 | 3.24772979e−013 |
| C3 | −4.32878458e−018 |
| C4 | 8.45718239e−023 |
| C5 | −7.59398340e−027 |
| C6 | −8.33908359e−032 |
| C7 | 0.00000000e+000 |
| C8 | 0.00000000e+000 |
| C9 | 0.00000000e+000 |
| SURFACE NO. 18 | |
| K | 0.0000 |
| C1 | 2.57656877e−008 |
| C2 | −5.66778843e−013 |
| C3 | 1.33836752e−017 |
| C4 | 1.55594835e−021 |
| C5 | −2.95962449e−026 |
| C6 | 8.80071238e−032 |
| C7 | 0.00000000e+000 |
| C8 | 0.00000000e+000 |
| C9 | 0.00000000e+000 |
| SURFACE NO. 21 | |
| K | 0.0000 |
| C1 | 3.59827387e−008 |
| C2 | −1.04290688e−012 |
| C3 | −2.20602889e−016 |
| C4 | −6.36815229e−021 |
| C5 | −1.16915922e−024 |
| C6 | 9.91429003e−029 |
| C7 | 0.00000000e+000 |
| C8 | 0.00000000e+000 |
| C9 | 0.00000000e+000 |

TABLE 6-continued

| ASPHERIC CONSTANTS | |
|---|---|
| SURFACE NO. 23 | |
| K | 0.0000 |
| C1 | −2.10673727e−008 |
| C2 | −3.25666446e−013 |
| C3 | 8.28426536e−017 |
| C4 | −5.44862524e−021 |
| C5 | 1.92784030e−025 |
| C6 | −2.98813211e−030 |
| C7 | 0.00000000e+000 |
| C8 | 0.00000000e+000 |
| C9 | 0.00000000e+000 |
| SURFACE NO. 24 | |
| K | 0.0000 |
| C1 | −1.96101498e−008 |
| C2 | 5.26331679e−013 |
| C3 | −7.77887850e−018 |
| C4 | −8.47002846e−023 |
| C5 | 8.55175584e−027 |
| C6 | 8.94134535e−032 |
| C7 | 0.00000000e+000 |
| C8 | 0.00000000e+000 |
| C9 | 0.00000000e+000 |
| SURFACE NO. 26 | |
| K | 0.0000 |
| C1 | −3.49919825e−009 |
| C2 | −1.30490066e−014 |
| C3 | −5.06174090e−019 |
| C4 | 9.13296563e−023 |
| C5 | −2.55183113e−027 |
| C6 | 3.40427662e−032 |
| C7 | 0.00000000e+000 |
| C8 | 0.00000000e+000 |
| C9 | 0.00000000e+000 |
| SURFACE NO. 33 | |
| K | 0.0000 |
| C1 | −3.95098549e−010 |
| C2 | 6.14454866e−014 |
| C3 | −8.49150328e−019 |
| C4 | 1.23852443e−023 |
| C5 | −1.40221953e−028 |
| C6 | 1.12769246e−033 |
| C7 | 0.00000000e+000 |
| C8 | 0.00000000e+000 |
| C9 | 0.00000000e+000 |
| SURFACE NO. 37 | |
| K | 0.0000 |
| C1 | −6.81965171e−010 |
| C2 | 1.52609195e−013 |
| C3 | −2.77686953e−018 |
| C4 | 7.44204272e−023 |
| C5 | −1.04495599e−027 |
| C6 | 1.09377342e−032 |
| C7 | 0.00000000e+000 |
| C8 | 0.00000000e+000 |
| C9 | 0.00000000e+000 |
| SURFACE NO. 39 | |
| K | 0.0000 |
| C1 | −1.36259017e−008 |
| C2 | −5.89574710e−013 |
| C3 | 4.45586739e−017 |
| C4 | −3.23689763e−021 |
| C5 | 1.35843971e−025 |
| C6 | −2.48308030e−030 |
| C7 | 0.00000000e+000 |
| C8 | 0.00000000e+000 |
| C9 | 0.00000000e+000 |

TABLE 6-continued

ASPHERIC CONSTANTS

SURFACE NO. 40

| | |
|---|---|
| K | 0.0000 |
| C1 | 3.65468233e-009 |
| C2 | -4.30642726e-013 |
| C3 | -2.68984250e-017 |
| C4 | -3.34659737e-021 |

TABLE 6-continued

ASPHERIC CONSTANTS

| | |
|---|---|
| C5 | -8.98569869e-026 |
| C6 | -7.82863465e-030 |
| C7 | 0.00000000e+000 |
| C8 | 0.00000000e+000 |
| C9 | 0.00000000e+000 |

TABLE 7

| SURFACE | RADII | | THICKNESS | MATERIAL | INDEX | ½ DIA. |
|---|---|---|---|---|---|---|
| 0 | 0.000000000 | | 32.000000000 | LUFTV193 | 1.00030168 | 56.080 |
| 1 | 0.000000000 | | 0.000000000 | LUFTV193 | 1.00030168 | 65.489 |
| 2 | -1062.644333890 | AS | 7.338632000 | SIO2V | 1.56078570 | 65.489 |
| 3 | 255.022949911 | | 16.160579368 | N2VP950 | 1.00029968 | 68.355 |
| 4 | -489.014433512 | AS | 7.338632000 | SIO2V | 1.56078570 | 69.941 |
| 5 | -953.561289631 | | 30.032974919 | N2VP950 | 1.00029966 | 72.518 |
| 6 | -107.396495083 | | 74.650939249 | SIO2V | 1.56078570 | 74.020 |
| 7 | -161.142164897 | | 0.917329000 | N2VP950 | 1.00029966 | 111.131 |
| 8 | -488.188913438 | AS | 30.492609399 | SIO2V | 1.56078570 | 125.220 |
| 9 | -232.490185472 | | 0.917329000 | N2VP950 | 1.00029966 | 127.932 |
| 10 | 1343.823788180 | | 38.249501740 | SIO2V | 1.56078570 | 138.358 |
| 11 | -419.035035978 | | 0.917329000 | N2VP950 | 1.00029966 | 139.112 |
| 12 | 306.451436457 | | 35.457384811 | SIO2V | 1.56078570 | 137.109 |
| 13 | 2158.254218050 | | 0.917329000 | | 1.00000000 | 135.666 |
| 14 | 159.158336522 | | 32.442139208 | SIO2V | 1.56078570 | 121.180 |
| 15 | 127.737640923 | AS | 4.348966155 | N2VP950 | 1.00029966 | 104.078 |
| 16 | 118.494774202 | | 54.712473071 | SIO2V | 1.56078570 | 102.621 |
| 17 | 412.552433435 | | 16.035419865 | N2VP950 | 1.00029966 | 98.302 |
| 18 | -4861.779621850 | | 7.338632000 | SIO2V | 1.56078570 | 95.571 |
| 19 | 91.974383893 | | 43.651541247 | N2VP950 | 1.00029966 | 74.779 |
| 20 | 327.075494024 | | 7.338632000 | SIO2V | 1.56078570 | 74.236 |
| 21 | 135.224109914 | AS | 61.165891668 | N2VP950 | 1.00029966 | 72.300 |
| 22 | -94.564006353 | | 7.338632000 | SIO2V | 1.56078570 | 73.152 |
| 23 | 443.040353676 | AS | 31.146857264 | N2VP950 | 1.00029966 | 95.986 |
| 24 | -279.871691536 | AS | 60.693055925 | SIO2V | 1.56078570 | 99.666 |
| 25 | -136.823756204 | | 0.917329000 | N2VP950 | 1.00029966 | 114.157 |
| 26 | 704.411514093 | AS | 35.987586734 | SIO2V | 1.56078570 | 154.664 |
| 27 | -948.888201521 | | 0.917329000 | N2VP950 | 1.00029966 | 156.351 |
| 28 | 559.811238443 | | 31.625999039 | SIO2V | 1.56078570 | 166.779 |
| 29 | 12181.115095000 | | 0.917329000 | N2VP950 | 1.00029966 | 167.117 |
| 30 | 380.238637765 | | 27.195202255 | SIO2V | 1.56078570 | 170.304 |
| 31 | 343.392987049 | | 92.899538604 | N2VP950 | 1.00029966 | 166.494 |
| 32 | -322.169569503 | | 29.169280971 | SIO2V | 1.56078570 | 166.857 |
| 33 | -260.838847150 | | 9.648793391 | N2VP950 | 1.00029966 | 170.326 |
| 34 | 0.000000000 | | 0.000000000 | N2VP950 | 1.00029966 | 169.266 |
| 35 | 0.000000000 | | -5.070393391 | N2VP950 | 1.00029966 | 169.539 |
| 36 | 1144.263596070 | | 39.257312498 | SIO2V | 1.56078570 | 170.163 |
| 37 | -798.249268006 | AS | 0.917329000 | N2VP950 | 1.00029966 | 170.326 |
| 38 | 229.347879309 | | 46.353683772 | SIO2V | 1.56078570 | 162.434 |
| 39 | 462.344917067 | | 0.917329000 | N2VP950 | 1.00029966 | 159.641 |
| 40 | 211.811588624 | | 34.925776908 | SIO2V | 1.56078570 | 147.256 |
| 41 | 350.839735917 | AS | 0.921675011 | N2VP950 | 1.00029966 | 143.083 |
| 42 | 165.268731319 | | 38.136683982 | SIO2V | 1.56078570 | 126.377 |
| 43 | 299.200544748 | AS | 0.875756502 | N2VP950 | 1.00029966 | 120.636 |
| 44 | 137.008198061 | | 116.675902093 | SIO2V | 1.56078570 | 102.388 |
| 45 | 0.000000000 | | 13.114474182 | H2OV | 1.43636732 | 30.176 |
| 46 | 0.000000000 | | -0.000004642 | | 1.00000000 | 14.020 |

TABLE 8

ASPHERIC CONSTANTS

SURFACE NO. 2

| | |
|---|---|
| K | 0.0000 |
| C1 | 1.68614396e−007 |
| C2 | −1.62938343e−011 |
| C3 | 1.05824627e−015 |
| C4 | −1.37635154e−019 |
| C5 | 1.19544176e−023 |
| C6 | −1.08466996e−027 |
| C7 | 0.00000000e+000 |
| C8 | 0.00000000e+000 |
| C9 | 0.00000000e+000 |

SURFACE NO. 4

| | |
|---|---|
| K | 0.0000 |
| C1 | 2.66602257e−008 |
| C2 | 8.08770917e−012 |
| C3 | −5.17405228e−016 |
| C4 | 5.24648371e−020 |
| C5 | −5.31079981e−024 |
| C6 | 7.03891423e−028 |
| C7 | 0.00000000e+000 |
| C8 | 0.00000000e+000 |
| C9 | 0.00000000e+000 |

SURFACE NO. 8

| | |
|---|---|
| K | 0.0000 |
| C1 | 5.53338685e−010 |
| C2 | 1.96957668e−013 |
| C3 | 3.33693370e−018 |
| C4 | 8.08706552e−023 |
| C5 | −4.53301354e−027 |
| C6 | 5.92857180e−032 |
| C7 | 0.00000000e+000 |
| C8 | 0.00000000e+000 |
| C9 | 0.00000000e+000 |

SURFACE NO. 15

| | |
|---|---|
| K | 0.0000 |
| C1 | 4.38226999e−009 |
| C2 | 3.29996569e−013 |
| C3 | 1.05160037e−017 |
| C4 | 1.87360439e−021 |
| C5 | −9.58603937e−026 |
| C6 | 9.89801169e−030 |
| C7 | 0.00000000e+000 |
| C8 | 0.00000000e+000 |
| C9 | 0.00000000e+000 |

SURFACE NO. 21

| | |
|---|---|
| K | 0.0000 |
| C1 | −5.05562903e−008 |
| C2 | −1.71111261e−012 |
| C3 | −2.39846224e−016 |
| C4 | −9.56041789e−021 |
| C5 | −2.55077988e−024 |
| C6 | 1.19373744e−028 |
| C7 | 0.00000000e+000 |
| C8 | 0.00000000e+000 |
| C9 | 0.00000000e+000 |

SURFACE NO. 23

| | |
|---|---|
| K | 0.0000 |
| C1 | −9.36460326e−009 |
| C2 | −1.95070287e−012 |
| C3 | 1.26771856e−016 |
| C4 | −1.61670698e−021 |
| C5 | −1.70527743e−025 |
| C6 | 4.82096354e−030 |
| C7 | 0.00000000e+000 |
| C8 | 0.00000000e+000 |
| C9 | 0.00000000e+000 |

SURFACE NO. 24

| | |
|---|---|
| K | 0.0000 |
| C1 | −1.57685441e−008 |
| C2 | 7.13669735e−013 |

TABLE 8-continued

ASPHERIC CONSTANTS

| | |
|---|---|
| C3 | 1.19267788e−017 |
| C4 | 1.05805275e−021 |
| C5 | −5.62569676e−026 |
| C6 | 4.37929930e−030 |
| C7 | 0.00000000e+000 |
| C8 | 0.00000000e+000 |
| C9 | 0.00000000e+000 |

SURFACE NO. 26

| | |
|---|---|
| K | 0.0000 |
| C1 | −9.64817190e−010 |
| C2 | −9.31263573e−014 |
| C3 | 8.41272007e−019 |
| C4 | 1.13509448e−023 |
| C5 | −3.23524042e−028 |
| C6 | 2.54061862e−034 |
| C7 | 0.00000000e+000 |
| C8 | 0.00000000e+000 |
| C9 | 0.00000000e+000 |

SURFACE NO. 37

| | |
|---|---|
| K | 0.0000 |
| C1 | −2.58804293e−009 |
| C2 | 5.52462737e−014 |
| C3 | 1.45362116e−019 |
| C4 | −8.27631859e−024 |
| C5 | 1.95716231e−028 |
| C6 | −1.15654876e−033 |
| C7 | 0.00000000e+000 |
| C8 | 0.00000000e+000 |
| C9 | 0.00000000e+000 |

SURFACE NO. 41

| | |
|---|---|
| K | 0.0000 |
| C1 | 7.57307476e−010 |
| C2 | 9.35948303e−014 |
| C3 | 2.83877521e−018 |
| C4 | −3.88341724e−023 |
| C5 | −4.69204092e−028 |
| C6 | 2.40453633e−032 |
| C7 | 0.00000000e+000 |
| C8 | 0.00000000e+000 |
| C9 | 0.00000000e+000 |

SURFACE NO. 43

| | |
|---|---|
| K | 0.0000 |
| C1 | 1.65656760e−008 |
| C2 | −3.94462332e−013 |
| C3 | 5.26534821e−018 |
| C4 | 8.11693181e−023 |
| C5 | 8.51261908e−028 |
| C6 | −8.63707035e−033 |
| C7 | 0.00000000e+000 |
| C8 | 0.00000000e+000 |
| C9 | 0.00000000e+000 |

TABLE 9

| SURFACE | RADII | | THICKNESS | MATERIAL | INDEX | ½ DIA. |
|---|---|---|---|---|---|---|
| 0 | 0.000000000 | | 9.142005173 | LUFTV193 | 1.00030168 | 56.080 |
| 1 | 0.000000000 | | 0.000000000 | LUFTV193 | 1.00030168 | 58.731 |
| 2 | −1470.436757260 | AS | 13.765312317 | SIO2V | 1.56078570 | 58.731 |
| 3 | −3309.611646770 | | 13.689116258 | N2VP950 | 1.00029966 | 60.942 |
| 4 | −153.660957229 | AS | 16.198295814 | SIO2V | 1.56078570 | 61.761 |
| 5 | −1763.435772780 | | 31.442460406 | N2VP950 | 1.00029966 | 69.003 |
| 6 | −101.844101742 | | 76.042936327 | SIO2V | 1.56078570 | 70.803 |
| 7 | −163.782835464 | | 0.917378575 | N2VP950 | 1.00029966 | 108.830 |
| 8 | −1459.635075060 | AS | 54.159718049 | SIO2V | 1.56078570 | 125.867 |
| 9 | −248.697896110 | | 4.472798922 | N2VP950 | 1.00029966 | 132.539 |
| 10 | 560.790862895 | | 42.185267856 | SIO2V | 1.56078570 | 141.601 |
| 11 | −609.964403728 | | 0.918264301 | N2VP950 | 1.00029966 | 141.592 |
| 12 | 198.271861860 | | 27.448715534 | SIO2V | 1.56078570 | 132.123 |
| 13 | 290.843457645 | | 0.917329000 | | 1.00000000 | 129.324 |
| 14 | 188.555316943 | | 20.510844557 | SIO2V | 1.56078570 | 123.887 |
| 15 | 247.160314957 | AS | 0.917329000 | N2VP950 | 1.00029966 | 120.246 |
| 16 | 155.775852649 | | 47.187992124 | SIO2V | 1.56078570 | 113.216 |
| 17 | 664.453413397 | | 13.812670100 | N2VP950 | 1.00029966 | 108.654 |
| 18 | −3356.640701870 | | 8.416525213 | SIO2V | 1.56078570 | 105.334 |
| 19 | 90.376617717 | AS | 54.983687982 | N2VP950 | 1.00029966 | 78.772 |
| 20 | 415.881397199 | | 24.694228340 | SIO2V | 1.56078570 | 76.825 |
| 21 | 136.348844236 | AS | 53.170614917 | N2VP950 | 1.00029966 | 71.868 |
| 22 | −101.270354507 | | 7.338632000 | SIO2V | 1.56078570 | 72.201 |
| 23 | 315.798684812 | AS | 30.566540809 | N2VP950 | 1.00029966 | 91.548 |
| 24 | −323.927336065 | AS | 57.126593193 | SIO2V | 1.56078570 | 95.152 |
| 25 | −134.032849637 | | 0.917337523 | N2VP950 | 1.00029966 | 108.301 |
| 26 | 774.857052737 | AS | 32.455181674 | SIO2V | 1.56078570 | 142.537 |
| 27 | −796.651828605 | | 0.917486275 | N2VP950 | 1.00029966 | 144.320 |
| 28 | 2090.903995650 | | 19.600542254 | SIO2V | 1.56078570 | 149.676 |
| 29 | −1654.430592690 | | 106.639451642 | N2VP950 | 1.00029966 | 150.742 |
| 30 | −251.588121950 | | 48.355102294 | SIO2V | 1.56078570 | 160.496 |
| 31 | −218.239336745 | | 26.904051486 | N2VP950 | 1.00029966 | 170.054 |
| 32 | 0.000000000 | | 0.000000000 | N2VP950 | 1.00029966 | 169.725 |
| 33 | 0.000000000 | | −22.325651487 | N2VP950 | 1.00029966 | 170.012 |
| 34 | 553.234026434 | | 47.365023716 | SIO2V | 1.56078570 | 170.296 |
| 35 | −1166.719282260 | AS | 0.917329000 | N2VP950 | 1.00029966 | 170.011 |
| 36 | 251.636939637 | | 38.983925925 | SIO2V | 1.56078570 | 160.302 |
| 37 | 490.044240843 | | 0.917329000 | N2VP950 | 1.00029966 | 157.650 |
| 38 | 225.522557608 | | 32.229047503 | SIO2V | 1.56078570 | 146.808 |
| 39 | 379.561748132 | AS | 0.917329000 | N2VP950 | 1.00029966 | 142.928 |
| 40 | 161.928081339 | | 40.681093415 | SIO2V | 1.56078570 | 125.478 |
| 41 | 296.179623509 | AS | 0.264406882 | N2VP950 | 1.00029966 | 119.880 |
| 42 | 142.195492897 | | 115.800030845 | SIO2V | 1.56078570 | 102.493 |
| 43 | 0.000000000 | | 13.207879330 | H2OV | 1.43636732 | 29.971 |
| 44 | 0.000000000 | | −0.000004642 | | 1.00000000 | 14.020 |

TABLE 10

ASPHERIC CONSTANTS

SURFACE NO. 2

| K | 0.0000 |
|---|---|
| C1 | 1.12469050e−007 |
| C2 | −3.50824385e−012 |
| C3 | −2.74862507e−016 |
| C4 | −9.33617181e−020 |
| C5 | 4.62214912e−023 |
| C6 | −2.44278252e−027 |
| C7 | 0.00000000e+000 |
| C8 | 0.00000000e+000 |
| C9 | 0.00000000e+000 |

TABLE 10-continued

ASPHERIC CONSTANTS

SURFACE NO. 4

| K | 0.0000 |
|---|---|
| C1 | 1.40101009e−007 |
| C2 | −9.52563322e−013 |
| C3 | 3.75239564e−017 |
| C4 | −7.55582902e−020 |
| C5 | 6.00534431e−024 |
| C6 | −2.68655709e−027 |
| C7 | 0.00000000e+000 |
| C8 | 0.00000000e+000 |
| C9 | 0.00000000e+000 |

TABLE 10-continued

ASPHERIC CONSTANTS

SURFACE NO. 8

| | |
|---|---|
| K | 0.0000 |
| C1 | −7.38527199e−009 |
| C2 | 6.03324901e−013 |
| C3 | −1.60270644e−017 |
| C4 | 4.33148931e−022 |
| C5 | −8.09105093e−027 |
| C6 | 4.84794945e−032 |
| C7 | 0.00000000e+000 |
| C8 | 0.00000000e+000 |
| C9 | 0.00000000e+000 |

SURFACE NO. 15

| | |
|---|---|
| K | 0.0000 |
| C1 | 6.99382393e−009 |
| C2 | 2.94148363e−013 |
| C3 | −9.11800329e−018 |
| C4 | 1.91618690e−022 |
| C5 | −4.40019705e−027 |
| C6 | −1.08562596e−031 |
| C7 | 0.00000000e+000 |
| C8 | 0.00000000e+000 |
| C9 | 0.00000000e+000 |

SURFACE NO. 19

| | |
|---|---|
| K | −0.1408 |
| C1 | 0.00000000e+000 |
| C2 | 0.00000000e+000 |
| C3 | 0.00000000e+000 |
| C4 | 0.00000000e+000 |
| C5 | 0.00000000e+000 |
| C6 | 0.00000000e+000 |
| C7 | 0.00000000e+000 |
| C8 | 0.00000000e+000 |
| C9 | 0.00000000e+000 |

SURFACE NO. 21

| | |
|---|---|
| K | 0.0000 |
| C1 | −1.89926056e−008 |
| C2 | −9.48909538e−013 |
| C3 | −1.00991502e−016 |
| C4 | −1.76312640e−020 |
| C5 | −3.18703391e−025 |
| C6 | −2.53640530e−028 |
| C7 | 0.00000000e+000 |
| C8 | 0.00000000e+000 |
| C9 | 0.00000000e+000 |

SURFACE NO. 23

| | |
|---|---|
| K | 0.0000 |
| C1 | −1.45577789e−008 |
| C2 | −1.93419367e−012 |
| C3 | 8.86661418e−017 |
| C4 | 4.86248409e−021 |
| C5 | −5.62562318e−025 |
| C6 | 1.49006191e−029 |
| C7 | 0.00000000e+000 |
| C8 | 0.00000000e+000 |
| C9 | 0.00000000e+000 |

SURFACE NO. 24

| | |
|---|---|
| K | 0.0000 |
| C1 | −2.59671120e−008 |
| C2 | 1.04865633e−012 |
| C3 | 2.30233796e−017 |
| C4 | 4.93824742e−022 |

TABLE 10-continued

ASPHERIC CONSTANTS

| | |
|---|---|
| C5 | −2.54396468e−026 |
| C6 | 3.57571325e−030 |
| C7 | 0.00000000e+000 |
| C8 | 0.00000000e+000 |
| C9 | 0.00000000e+000 |

SURFACE NO. 26

| | |
|---|---|
| K | 0.0000 |
| C1 | −3.10596549e−010 |
| C2 | −1.27212114e−013 |
| C3 | −2.15526174e−018 |
| C4 | 1.18522610e−022 |
| C5 | −2.43335508e−027 |
| C6 | 6.68951355e−033 |
| C7 | 0.00000000e+000 |
| C8 | 0.00000000e+000 |
| C9 | 0.00000000e+000 |

SURFACE NO. 35

| | |
|---|---|
| K | 0.0000 |
| C1 | −3.09623921e−009 |
| C2 | 1.10211887e−013 |
| C3 | −1.63603595e−018 |
| C4 | 2.33267959e−023 |
| C5 | −1.93983389e−028 |
| C6 | 1.41288956e−033 |
| C7 | 0.00000000e+000 |
| C8 | 0.00000000e+000 |
| C9 | 0.00000000e+000 |

SURFACE NO. 39

| | |
|---|---|
| K | 0.0000 |
| C1 | 1.45949460e−009 |
| C2 | 1.84182220e−014 |
| C3 | 7.21345576e−018 |
| C4 | −2.08810169e−022 |
| C5 | 4.09729831e−027 |
| C6 | −4.05213812e−032 |
| C7 | 0.00000000e+000 |
| C8 | 0.00000000e+000 |
| C9 | 0.00000000e+000 |

SURFACE NO. 41

| | |
|---|---|
| K | 0.0000 |
| C1 | 1.08716684e−008 |
| C2 | −5.59272513e−013 |
| C3 | 7.30283609e−018 |
| C4 | −1.55126694e−023 |
| C5 | 3.59751728e−027 |
| C6 | −4.37399769e−032 |
| C7 | 0.00000000e+000 |
| C8 | 0.00000000e+000 |
| C9 | 0.00000000e+000 |

TABLE 11

| SURFACE | RADII | | THICKNESS | MATERIAL | INDEX | ½ DIA. |
|---|---|---|---|---|---|---|
| 0 | 0.000000000 | | 31.931002664 | | 1.00000000 | 56.080 |
| 1 | −347.236440528 | AS | 8.000000000 | SIO2HL | 1.56028890 | 66.189 |
| 2 | 219.915562477 | | 31.898415726 | N2VP950 | 1.00000300 | 70.391 |
| 3 | −170.858136470 | | 8.000000000 | SIO2HL | 1.56028890 | 72.892 |
| 4 | 1107.474957290 | AS | 22.589356201 | N2VP950 | 1.00000300 | 89.106 |
| 5 | −218.108339374 | AS | 63.099650288 | SIO2HL | 1.56028890 | 93.885 |
| 6 | −135.240822500 | | 1.000000000 | N2VP950 | 1.00000300 | 109.625 |
| 7 | 32003.375547500 | | 47.413691277 | SIO2HL | 1.56028890 | 137.108 |
| 8 | −282.465638980 | | 1.000000000 | N2VP950 | 1.00000300 | 139.973 |
| 9 | 297.920255954 | | 48.926206712 | SIO2HL | 1.56028890 | 151.093 |
| 10 | −1765.218425420 | AS | 1.000000000 | N2VP950 | 1.00000300 | 149.869 |
| 11 | 155.350309269 | | 62.064795636 | SIO2HL | 1.56028890 | 138.044 |
| 12 | 287.967685928 | | 1.000000000 | N2VP950 | 1.00000300 | 131.984 |
| 13 | 197.466973091 | | 46.435923957 | SIO2HL | 1.56028890 | 123.714 |
| 14 | 155.967795233 | AS | 1.000000000 | N2VP950 | 1.00000300 | 102.169 |
| 15 | 175.615580039 | | 8.000000000 | SIO2HL | 1.56028890 | 98.890 |
| 16 | 81.433239279 | | 58.962282942 | N2VP950 | 1.00000300 | 76.029 |
| 17 | −1042.836597030 | | 8.000000000 | SIO2HL | 1.56028890 | 75.001 |
| 18 | 236.916783020 | AS | 57.069488559 | N2VP950 | 1.00000300 | 72.144 |
| 19 | −81.739367888 | | 8.000000000 | SIO2HL | 1.56028890 | 71.687 |
| 20 | 375.086948338 | AS | 30.278553523 | N2VP950 | 1.00000300 | 99.714 |
| 21 | −342.008757539 | | 57.142725147 | SIO2HL | 1.56028890 | 104.436 |
| 22 | −160.258782239 | | 1.000000000 | N2VP950 | 1.00000300 | 119.685 |
| 23 | −856.839164376 | AS | 34.689165048 | SIO2HL | 1.56028890 | 148.650 |
| 24 | −379.653604267 | | 1.000000000 | N2VP950 | 1.00000300 | 152.636 |
| 25 | 584.985383859 | AS | 45.511042875 | SIO2HL | 1.56028890 | 172.438 |
| 26 | −958.601764530 | | 1.000000000 | N2VP950 | 1.00000300 | 174.054 |
| 27 | 666.780520883 | AS | 50.027876765 | SIO2HL | 1.56028890 | 180.001 |
| 28 | −963.390274276 | | −11.963951541 | N2VP950 | 1.00000300 | 179.996 |
| 29 | 0.000000000 | | 29.192598777 | N2VP950 | 1.00000300 | 179.451 |
| 30 | 278.073032381 | | 42.845705807 | SIO2HL | 1.56028890 | 179.994 |
| 31 | 488.477056296 | | 1.000000000 | N2VP950 | 1.00000300 | 177.191 |
| 32 | 229.130061526 | | 59.928766081 | SIO2HL | 1.56028890 | 168.083 |
| 33 | 493.528859065 | AS | 1.000000000 | N2VP950 | 1.00000300 | 163.249 |
| 34 | 168.416619548 | | 45.625591423 | SIO2HL | 1.56028890 | 134.017 |
| 35 | 311.455238476 | AS | 1.000000000 | N2VP950 | 1.00000300 | 125.436 |
| 36 | 111.636678699 | | 48.342194715 | SIO2HL | 1.56028890 | 97.724 |
| 37 | 210.829981018 | AS | 1.000000000 | N2VP950 | 1.00000300 | 81.689 |
| 38 | 124.000721148 | | 73.536543337 | SIO2HL | 1.56028890 | 75.223 |
| 39 | 0.000000000 | | 1.737330768 | IMMERS | 1.43500000 | 16.708 |
| 40 | 0.000000000 | | 0.000000000 | | 1.00000000 | 14.020 |

TABLE 12

ASPHERIC CONSTANTS

SURFACE NO. 1

| K | 0.0000 |
|---|---|
| C1 | 3.43015837e−007 |
| C2 | −4.07245548e−011 |
| C3 | 5.68690697e−015 |
| C4 | −9.66005925e−019 |
| C5 | 1.80932906e−022 |
| C6 | −2.31865517e−026 |
| C7 | 1.32319202e−030 |
| C8 | 0.00000000e+000 |
| C9 | 0.00000000e+000 |

SURFACE NO. 4

| K | 0.0000 |
|---|---|
| C1 | 1.45742246e−007 |
| C2 | −2.96891550e−011 |
| C3 | 2.11941800e−015 |
| C4 | 1.87281593e−021 |
| C5 | −1.70520532e−023 |
| C6 | 1.41301018e−027 |
| C7 | −4.45795966e−032 |
| C8 | 0.00000000e+000 |
| C9 | 0.00000000e+000 |

TABLE 12-continued

ASPHERIC CONSTANTS

SURFACE NO. 5

| K | 0.0000 |
|---|---|
| C1 | 1.14210231e−007 |
| C2 | −2.56390958e−012 |
| C3 | 6.23158150e−017 |
| C4 | −1.54942908e−020 |
| C5 | 2.11301267e−024 |
| C6 | −1.87409843e−028 |
| C7 | 0.00000000e+000 |
| C8 | 0.00000000e+000 |
| C9 | 0.00000000e+000 |

SURFACE NO. 10

| K | 0.0000 |
|---|---|
| C1 | 3.14962178e−008 |
| C2 | −1.06476758e−012 |
| C3 | 3.51750146e−017 |
| C4 | −1.39021700e−021 |
| C5 | 5.08855180e−026 |
| C6 | −1.41732059e−030 |
| C7 | 2.05140486e−035 |
| C8 | 0.00000000e+000 |
| C9 | 0.00000000e+000 |

TABLE 12-continued

ASPHERIC CONSTANTS

SURFACE NO. 14

| | |
|---|---|
| K | 0.0000 |
| C1 | −1.80801250e−007 |
| C2 | 1.03835381e−011 |
| C3 | −1.22571643e−016 |
| C4 | −4.12834819e−021 |
| C5 | −2.33128210e−024 |
| C6 | 3.14464121e−028 |
| C7 | −1.42364051e−032 |
| C8 | 0.00000000e+000 |
| C9 | 0.00000000e+000 |

SURFACE NO. 18

| | |
|---|---|
| K | 0.0000 |
| C1 | 4.71514493e−008 |
| C2 | −4.46566204e−012 |
| C3 | −1.36375356e−015 |
| C4 | 3.64942050e−020 |
| C5 | −3.50695421e−023 |
| C6 | 6.42482495e−027 |
| C7 | −7.49653419e−031 |
| C8 | 0.00000000e+000 |
| C9 | 0.00000000e+000 |

SURFACE NO. 20

| | |
|---|---|
| K | 0.0000 |
| C1 | −1.99816626e−008 |
| C2 | −6.60214059e−012 |
| C3 | 1.10140693e−015 |
| C4 | −1.05954816e−019 |
| C5 | 6.81490959e−024 |
| C6 | −2.72419422e−028 |
| C7 | 4.97767443e−033 |
| C8 | 0.00000000e+000 |
| C9 | 0.00000000e+000 |

SURFACE NO. 23

| | |
|---|---|
| K | 0.0000 |
| C1 | 1.74400115e−008 |
| C2 | −8.35191566e−014 |
| C3 | −6.72245819e−018 |
| C4 | −1.48911061e−022 |
| C5 | 6.03163011e−027 |
| C6 | −7.22356694e−032 |
| C7 | −1.68350772e−036 |
| C8 | 0.00000000e+000 |
| C9 | 0.00000000e+000 |

SURFACE NO. 25

| | |
|---|---|
| K | 0.0000 |
| C1 | −6.26229360e−009 |
| C2 | −1.01689566e−013 |
| C3 | 1.24265213e−018 |
| C4 | 6.15676137e−023 |
| C5 | −1.81952531e−027 |
| C6 | 7.05339612e−032 |
| C7 | −1.30796023e−036 |
| C8 | 0.00000000e+000 |
| C9 | 0.00000000e+000 |

SURFACE NO. 27

| | |
|---|---|
| K | 0.0000 |
| C1 | −3.11584500e−009 |
| C2 | 4.54152967e−014 |
| C3 | 5.48854826e−019 |
| C4 | −1.07217364e−023 |
| C5 | −4.93680366e−028 |
| C6 | 4.40409387e−033 |
| C7 | 1.80136796e−037 |
| C8 | 0.00000000e+000 |
| C9 | 0.00000000e+000 |

SURFACE NO. 33

| | |
|---|---|
| K | 0.0000 |
| C1 | 2.03860365e−009 |
| C2 | −4.81770739e−013 |

TABLE 12-continued

ASPHERIC CONSTANTS

| | |
|---|---|
| C3 | 7.12906529e−018 |
| C4 | −9.89082418e−023 |
| C5 | 5.97992904e−027 |
| C6 | −1.39296989e−031 |
| C7 | 1.16280644e−036 |
| C8 | 0.00000000e+000 |
| C9 | 0.00000000e+000 |

SURFACE NO. 35

| | |
|---|---|
| K | 0.0000 |
| C1 | 1.36126851e−008 |
| C2 | −2.50085436e−013 |
| C3 | 1.07338114e−018 |
| C4 | 3.24701476e−021 |
| C5 | −1.00209509e−025 |
| C6 | −2.59101058e−031 |
| C7 | 1.08664414e−034 |
| C8 | 0.00000000e+000 |
| C9 | 0.00000000e+000 |

SURFACE NO. 37

| | |
|---|---|
| K | 0.0000 |
| C1 | 8.99963419e−008 |
| C2 | 6.04018944e−012 |
| C3 | −7.89329450e−017 |
| C4 | −2.13781701e−021 |
| C5 | 6.69330154e−024 |
| C6 | −7.04221608e−028 |
| C7 | 4.04933330e−032 |
| C8 | 0.00000000e+000 |
| C9 | 0.00000000e+000 |

The invention claimed is:

1. A refractive projection objective for imaging a pattern, arranged in an object plane of the projection objective, into an image plane of the projection objective, comprising
a first lens group directly following the object plane and of negative refractive power;
a second lens group directly following the first lens group and of positive refractive power;
a third lens group directly following the second lens group and of negative refractive power;
a fourth lens group directly following the third lens group and of positive refractive power;
a fifth lens group directly following the fourth lens group and of positive refractive power; and
a system diaphragm that is arranged in a transition region from the fourth lens group to the fifth lens group,
wherein the fourth lens group has an entrance surface that lies in the vicinity of a point of inflection of a marginal ray height between the third lens group and the fourth lens group, and no negative lens of substantial refractive power is arranged between the entrance surface and the system diaphragm, and
wherein the fifth lens group has exclusively lenses of positive refractive power.

2. The projection objective as claimed in claim 1, wherein only positive lenses are arranged between the entrance surface and the system diaphragm.

3. The projection objective as claimed in claim 1, wherein a waist of minimal beam diameter exists in the region of the third lens group, and a lens pair having lenses immediately following one another and for which $\phi_i \cdot \phi_{i+1} < 0$ exists between this waist and the image plane at only one location, $\phi_i$ and $\phi_{i+1}$ being the refractive powers of the lenses of the lens pair, and $|\phi_i| > 0.12$ m$^{-1}$.

4. The projection objective as claimed in claim 1, wherein lens pairs having lenses immediately following one another and for which $\phi_i^* \phi_{i+1} < 0$ exists between the object plane and the image plane only at three locations, $\phi_i$ and $\phi_{i+1}$ being the refractive powers of the lenses of the lens pair, and it being preferred that $|\phi_i| > 0.12 \text{ m}^{-1}$.

5. The projection objective as claimed in claim 1, wherein the first lens group includes at least one aspheric surface.

6. The projection objective as claimed in claim 1, wherein the first lens group includes at least two lenses each having one aspheric surface.

7. The projection objective as claimed in claim 1, wherein there is arranged in a first lens region in which the principal ray height is large as against the marginal ray height, at least one aspheric surface that has a curvature which has at most one point of inflection in an optically useful range.

8. The projection objective as claimed in claim 7, wherein not more than three aspheric surfaces having one or more points of inflection are arranged in the first lens region.

9. The projection objective as claimed in claim 1, wherein the aspheric surfaces of a first lens region fulfill the condition $|\Sigma C1_i|^*10^6 > 0.22$, $C1_i$ being the coefficient of a term $h^4$ of the aspheric surface representation of the ith surface.

10. The projection objective as claimed in claim 1, wherein a number of at least two aspheric surfaces with an optically useful diameter of more than 20% of an overall length of the projection objective are concave.

11. The projection objective as claimed in claim 1, wherein there are arranged in a second lens region, which extends between the object plane and a region in which a principal ray height corresponds substantially to a marginal ray height, at least two aspheric surfaces whose aspheric contributions to the distortion are of opposite signs.

12. The projection objective as claimed in claim 1, wherein at least one aspheric surface is provided in the third lens group.

13. The projection objective as claimed in claim 1, wherein there is provided in a transition region from the third lens group to the fourth lens group at least one lens doublet that comprises a negative lens of weakly refractive power and a positive lens following directly in the transmission direction, the negative lens having an image-side concave surface, and the subsequent positive lens having an object-side concave surface.

14. The projection objective as claimed in claim 13, wherein the positive lens is a positive meniscus lens that is concave relative to the object plane and has an entrance-end lens radius R1 and an exit-end lens radius R2, and fulfills the following condition: $(R1+R2)/(R1-R2) < -1.5$.

15. The projection objective as claimed in claim 13, wherein mutually facing concave surfaces of the lens doublet are aspheric.

16. The projection objective as claimed in claim 1, wherein at least one meniscus lens that is concave relative to the object plane and fulfills the condition $D_L/D_{min} > 1.3$ is arranged in the fourth lens group, $D_{min}$ being the smallest light pencil diameter in the fourth lens group and $D_L$ being the maximum light pencil diameter in the meniscus lens.

17. The projection objective as claimed in claim 1, wherein all the lenses consist of the same material.

18. The projection objective as claimed in claim 1, which has an image-side numerical aperture $NA \geq 0.98$.

19. The projection objective as claimed in claim 1, wherein the projection objective is adapted to an immersion medium that has a refractive index $n > 1.3$ at an operating wavelength.

20. The projection objective as claimed in claim 1, wherein the projection objective has an image-side working distance of at least one millimeter.

21. The projection objective as claimed in claim 1, having an object-side working distance that is smaller than 20 mm.

22. The projection objective as claimed in claim 21, wherein the projection objective has an image-side numerical aperture NA>0.8.

23. The projection objective as claimed in claim 1, wherein the projection objective has an object-side working distance that is smaller than 50% of the object field diameter.

24. The projection objective as claimed in claim 1, wherein the projection objective has an object-side working distance that lies between approximately 5 mm and approximately 25% of the object field diameter.

25. The projection objective as claimed in claim 1, wherein the second lens group has at least four consecutive lenses of positive refractive power.

26. The projection objective as claimed in claim 1, wherein on an entrance side facing the object plane the second lens group has at least one meniscus lens, concave relative to the object plane, of positive refractive power and, on the exit side facing the image plane, the second lens group has at least one meniscus lens, convex relative to the object plane, of positive refractive power.

27. The projection objective as claimed in claim 1, wherein the second lens group in this sequence has at least one meniscus lens, concave relative to the object plane, of positive refractive power, a biconvex positive lens and at least one meniscus lens, concave relative to the image plane, of positive refractive power.

28. The projection objective as claimed in claim 1, wherein the third lens group has only lenses of negative refractive power.

29. The projection objective as claimed in claim 1, wherein in an object-side entrance region the fourth lens group has at least one meniscus lens, concave relative to the object plane, of positive refractive power.

30. The projection objective as claimed in claim 1, wherein the fifth lens group has at least one meniscus lens of positive refractive power and lens surfaces that are concave toward the image.

31. The projection objective as claimed in claim 1, wherein the fifth lens group has as last optical element a planoconvex lens that has a spherical or aspherically curved entrance surface and a substantially flat exit surface.

32. The projection objective as claimed in claim 31, wherein the planoconvex lens is of non-hemispherical design.

33. The projection objective as claimed in claim 1, which is a one-waist system having a belly near the object, a belly near the image and one waist lying therebetween.

34. The projection objective as claimed in claim 1, wherein a maximum marginal ray height is at least twice as large as the marginal ray height at the location of the narrowest constriction.

35. The projection objective as claimed in claim 1, wherein a belly near the object has a first belly diameter, and a belly near the image has a second belly diameter, and wherein a belly diameter ratio between the second and the first belly diameters is more than 1.1.

36. The projection objective as claimed in claim 1, wherein the image plane follows directly after the fifth lens group such that apart from the first to fifth lens group the projection objective has no further lens or lens group.

37. A projection exposure machine for microlithography comprising a refractive projection objective as claimed in claim 1.

38. A method for producing semiconductor components and other finely structured components, having the following steps:

providing a mask with a prescribed pattern;

illuminating the mask with ultraviolet light of a prescribed wavelength;

imaging an image of the pattern onto a photosensitive substrate, arranged in the region of the image plane of a projection objective, with the aid of a projection objective in accordance with claim 1.

39. The method as claimed in claim 38, wherein an immersion medium is arranged between a last optical surface of the projection objective and the substrate being transirradiated during projection.

40. A refractive projection objective for imaging a pattern, arranged in an object plane of the projection objective, into an image plane of the projection objective, comprising a first lens group directly following the object plane and of negative refractive power;

a second lens group directly following the first lens group and of positive refractive power;

a third lens group directly following the second lens group and of negative refractive power;

a fourth lens group directly following the third lens group and of positive refractive power;

a fifth lens group directly following the fourth lens group and of positive refractive power; and a system diaphragm that is arranged in a transition region from the fourth lens group to the fifth lens group, wherein the fourth lens group has an entrance surface that lies in the vicinity of a point of inflection of a marginal ray height between the third lens group and the fourth lens group, and no negative lens of substantial refractive power is arranged between the entrance surface and the system diaphragm, and wherein at least one aspheric surface is arranged in each lens group.

41. The projection objective as claimed in claim 40, wherein at least two aspheric surfaces have a deformation of more than 1.2 mm relative to an assigned enveloping sphere.

42. The projection objective as claimed in claim 40, wherein the condition 0.9* PSA31<PSA3<1.1*PSA31 is fulfilled for the spherical pupil aberration PSA, PSA31 being the sum of the aberration coefficients of the spherical pupil aberration of all the surfaces within a first lens region, and PSA3 being the sum of the aberration coefficients of the spherical pupil aberration of all the surfaces of the system.

43. The projection objective as claimed in claim 40, which has an object/image distance L and a focal length f and is adapted to an immersion medium with a refractive index $n_I$, the following condition being fulfilled: $L/f*n_I>2.5$.

44. The projection objective as claimed in claim 40, wherein a predominant number of lenses consists of synthetic quartz glass, at least two of the lens elements arranged in the immediate vicinity of the image plane consisting of a fluoride crystal material of the same crystal orientation.

45. The projection objective as claimed in claim 40, wherein a predominant number of lenses consists of synthetic quartz glass, at least one positive lens made from a fluoride crystal material being provided in the second lens group.

46. The projection objective as claimed in claim 40, wherein a predominant number of lenses consists of synthetic quartz glass, at least one positive lens made from fluoride crystal material being provided in the fourth lens group.

47. The projection objective as claimed in claim 40, wherein a predominant number of lenses consists of synthetic quartz glass, at least one negative lens of the third lens group consisting of fluoride crystal material.

48. The projection objective as claimed in claim 40, wherein the projection objective is adapted to an immersion medium that has a refractive index n>1.3 at an operating wavelength.

49. A refractive projection objective for imaging a pattern, arranged in an object plane of the projection objective, into an image plane of the projection objective, comprising a first lens group directly following the object plane and of negative refractive power;

a second lens group directly following the first lens group and of positive refractive power;

a third lens group directly following the second lens group and of negative refractive power;

a fourth lens group directly following the third lens group and of positive refractive power;

a fifth lens group directly following the fourth lens group and of positive refractive power; and a system diaphragm that is arranged in a transition region from the fourth lens group to the fifth lens group, wherein the fourth lens group has an entrance surface that lies in the vicinity of a point of inflection of a marginal ray height between the third lens group and the fourth lens group, and no negative lens of substantial refractive power is arranged between the entrance surface and the system diaphragm, and wherein the system diaphragm has a diaphragm edge that determines the diaphragm diameter and whose axial position with reference to the optical axis of the projection objective can be varied as a function of the diaphragm diameter.

50. The projection objective as claimed in claim 49, wherein the system diaphragm is designed as a spherical diaphragm or as a conical diaphragm.

51. The projection objective as claimed in claim 49, wherein the system diaphragm is axially displaceable.

52. The projection objective as claimed in claim 49, which has an image-side numerical aperture NA≧0.98.

53. The projection objective as claimed in claim 49, wherein the projection objective is adapted to an immersion medium that has a refractive index n>1.3 at an operating wavelength.

* * * * *

UNITED STATES PATENT AND TRADEMARK OFFICE
CERTIFICATE OF CORRECTION

| | | |
|---|---|---|
| PATENT NO. | : 7,751,129 B2 | |
| APPLICATION NO. | : 10/576754 | |
| DATED | : July 6, 2010 | |
| INVENTOR(S) | : Aurelian Dodoc, Wilhelm Ulrich and Hans-Juergen Rostalski | |

It is certified that error appears in the above-identified patent and that said Letters Patent is hereby corrected as shown below:

Column 8, line 3: delete "$|h_B/h_C|1$" and insert --$|h_B/h_C|<1$--

Column 8, line 10: delete "$|h_B/h_A<1.2$" and insert --$|h_B/h_A|<1.2$--

Column 39, line 47: delete "focal length f" and insert --focal length f'--

Column 39, line 49: delete "$L/f*n_I>2.5.$" and insert --$L/f'*n_I>2.5.$--

Signed and Sealed this
Twenty-second Day of February, 2011

David J. Kappos
*Director of the United States Patent and Trademark Office*